United States Patent
Chang et al.

(10) Patent No.: US 11,245,034 B2
(45) Date of Patent: Feb. 8, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuei-Ming Chang, New Taipei (TW); Ta-Chun Lin, Hsinchu (TW); Rei-Jay Hsieh, Miaoli County (TW); Yung-Chih Wang, Hsinchu (TW); Wen-Huei Guo, Hsinchu County (TW); Kuo-Hua Pan, Hsinchu (TW); Buo-Chin Hsu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 101 days.

(21) Appl. No.: 15/962,181

(22) Filed: Apr. 25, 2018

(65) Prior Publication Data

US 2019/0334035 A1 Oct. 31, 2019

(51) Int. Cl.
*H01L 29/78* (2006.01)
*H01L 29/66* (2006.01)
*H01L 21/8234* (2006.01)
*H01L 21/762* (2006.01)
*H01L 29/417* (2006.01)

(52) U.S. Cl.
CPC .... *H01L 29/7851* (2013.01); *H01L 21/76232* (2013.01); *H01L 21/823412* (2013.01); *H01L 21/823431* (2013.01); *H01L 21/823437* (2013.01); *H01L 29/41791* (2013.01); *H01L 29/66545* (2013.01); *H01L 29/66795* (2013.01)

(58) Field of Classification Search
CPC ....... H01L 21/76232; H01L 21/823481; H01L 21/823821; H01L 21/823431; H01L 29/41791; H01L 29/785; H01L 29/66795; H01L 29/66545; H01L 29/7851; H01L 21/823412; H01L 21/823437; H01L 29/7848
See application file for complete search history.

(56) References Cited

U.S. PATENT DOCUMENTS

| | | | |
|---|---|---|---|
| 9,653,583 B1* | 5/2017 | Zhao | H01L 29/66795 |
| 2016/0163604 A1* | 6/2016 | Xie | H01L 21/823878 |
| | | | 257/401 |
| 2016/0380052 A1* | 12/2016 | Kim | H01L 27/1211 |
| | | | 257/401 |
| 2017/0110456 A1* | 4/2017 | Jeon | H01L 29/0653 |
| 2018/0261596 A1* | 9/2018 | Jun | H01L 27/0886 |
| 2018/0308769 A1* | 10/2018 | Chang | H01L 21/76232 |

* cited by examiner

*Primary Examiner* — Hoang-Quan Ho
(74) *Attorney, Agent, or Firm* — McClure, Qualey & Rodack, LLP

(57) ABSTRACT

A semiconductor device includes a substrate, first and second source/drain features, and a dielectric plug. The substrate has a semiconductor fin. The first and second source/drain features are over first and second portions of the semiconductor fin, respectively. The dielectric plug is at least partially embedded in a third portion of the semiconductor fin. The third portion is in between the first and second portions of the semiconductor fin. The dielectric plug includes a first dielectric material and a second dielectric material different from the first dielectric material.

20 Claims, 32 Drawing Sheets

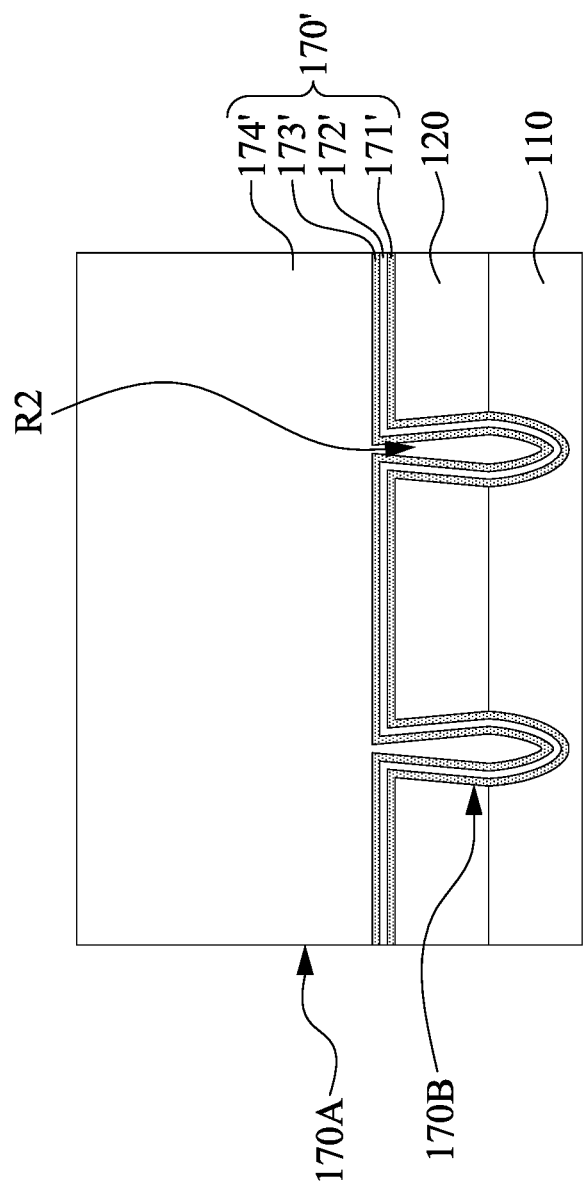

US 11,245,034 B2

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
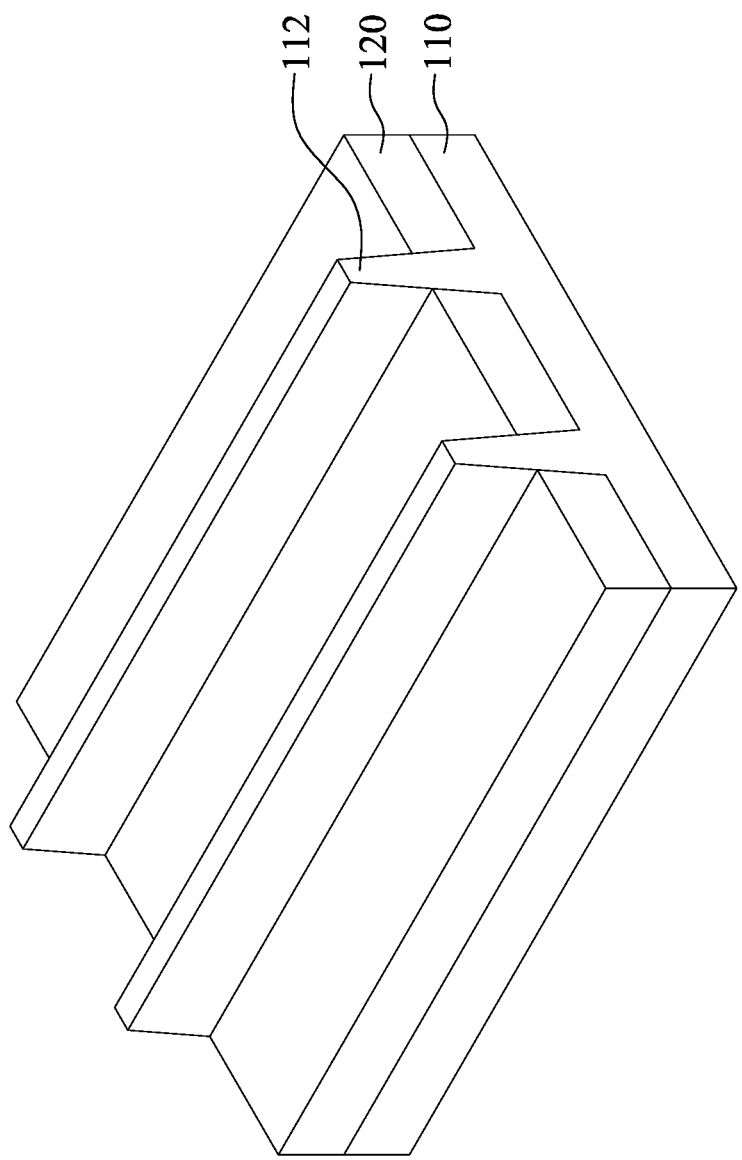
FIGS. 1-10B illustrate a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-10B illustrate a method of manufacturing a semiconductor device at various stages in accordance with some embodiments.

Reference is made to FIG. 1. A substrate 110 including plural semiconductor fins 112 is provided. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may further include various active regions, such as regions configured for an N-type metal-oxide-semiconductor transistor device and regions configured for a P-type metal-oxide-semiconductor transistor device.

The semiconductor fins 112 may be formed by any suitable method. For example, the semiconductor fins 112 may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

A plurality of isolation structures 120 are formed over the substrate 110 and adjacent to the semiconductor fins 112. The isolation structures 120, which act as a shallow trench isolation (STI) around the semiconductor fins 112 may be formed by chemical vapor deposition (CVD) techniques using tetra-ethyl-ortho-silicate (TEOS) and oxygen as a precursor. In some other embodiments, the isolation structure 120 is insulator layers of a SOI wafer.

Figure 2:
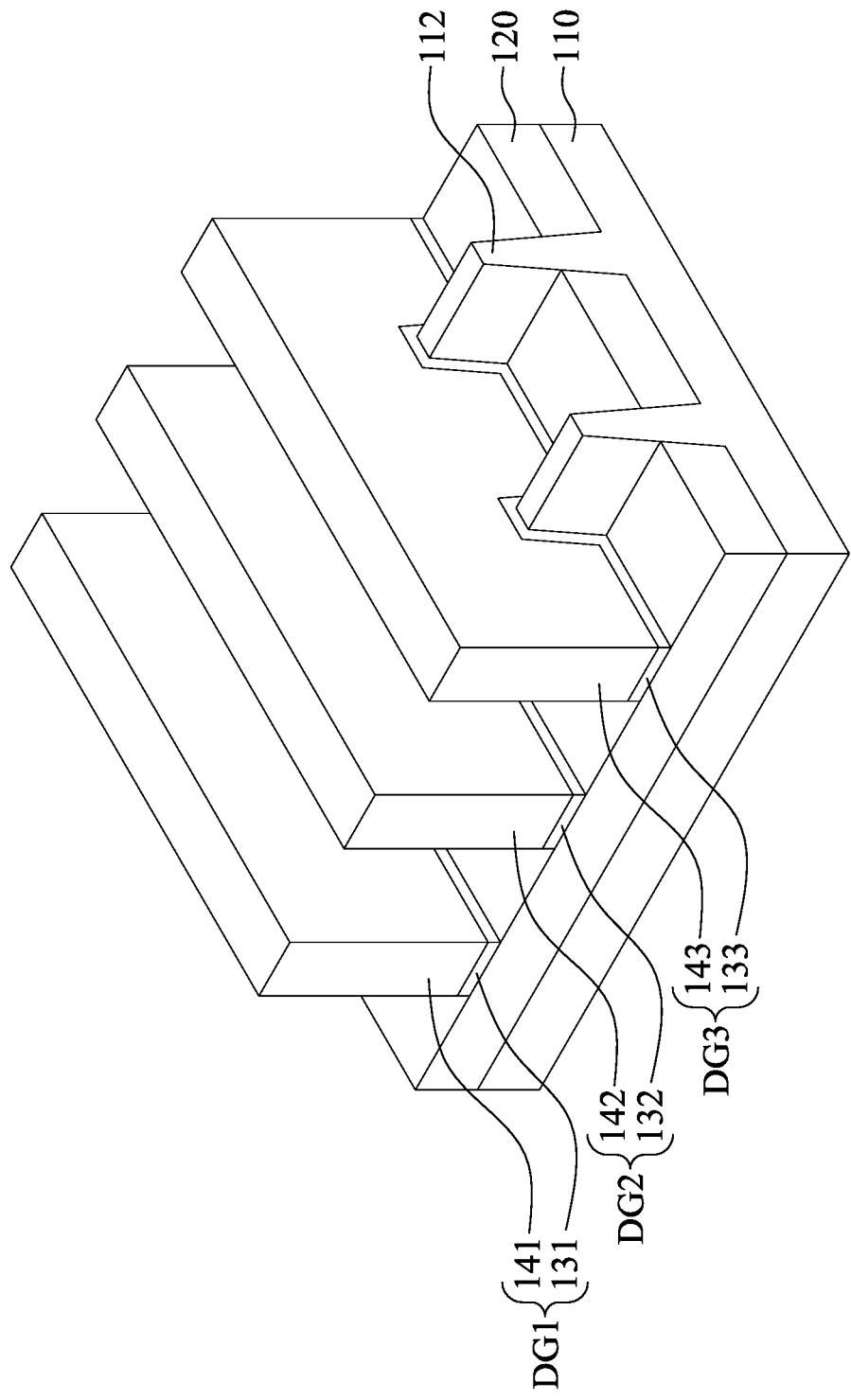

Reference is made to FIG. 2. A plurality of dummy gate stacks DG1, DG2, and DG3 are formed around the semiconductor fins 112 of the substrate 110, in which the dummy gate stack DG2 is between the dummy gate stacks DG1 and DG3.

In some embodiments, the dummy gate stack DG1 includes a dummy gate 141 and a gate dielectric 131 underlying the dummy gate 141, the dummy gate stack DG2 includes a dummy gate 142 and a gate dielectric 132 underlying the dummy gate 142, and the dummy gate stack DG3 includes a dummy gate 143 and a gate dielectric 133 underlying the dummy gate 143. The dummy gates 141, 142, and 143 may include polycrystalline-silicon (poly-Si) or poly-crystalline silicon-germanium (poly-SiGe). Further, the dummy gates 141, 142, and 143 may be doped poly-silicon with uniform or non-uniform doping. The gate dielectrics 131, 132, and 133 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

In some embodiments, the dummy gate stacks DG1, DG2, and DG3 may be formed by, for example, forming a stack of a gate dielectric layer and a dummy gate material layer over the substrate 110. A patterned mask is formed over the stack of gate dielectric layer and dummy gate material layer. Then, the gate dielectric layer and the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the semiconductor fins 112 are exposed.

Figure 3A:
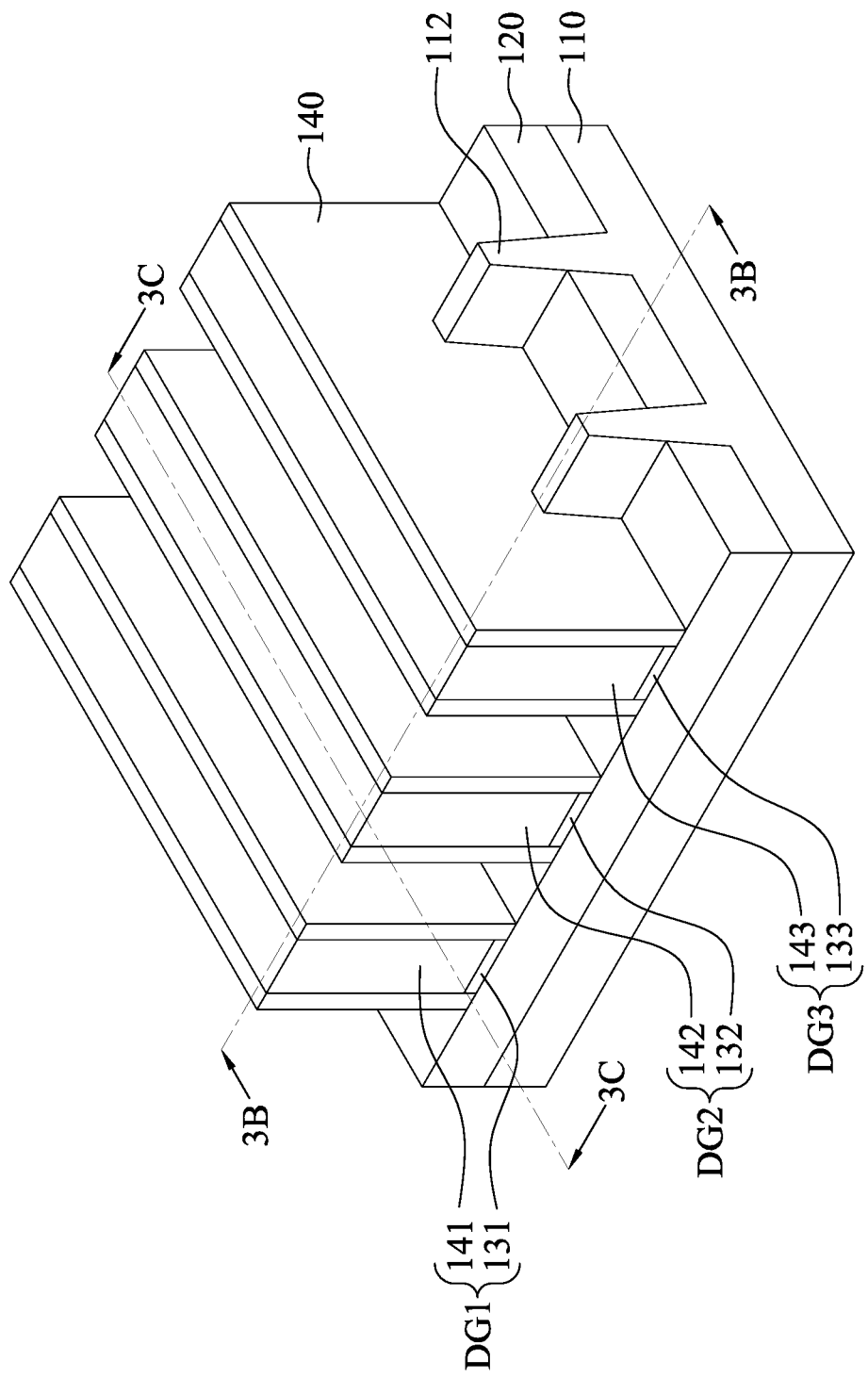
Figure 3B:
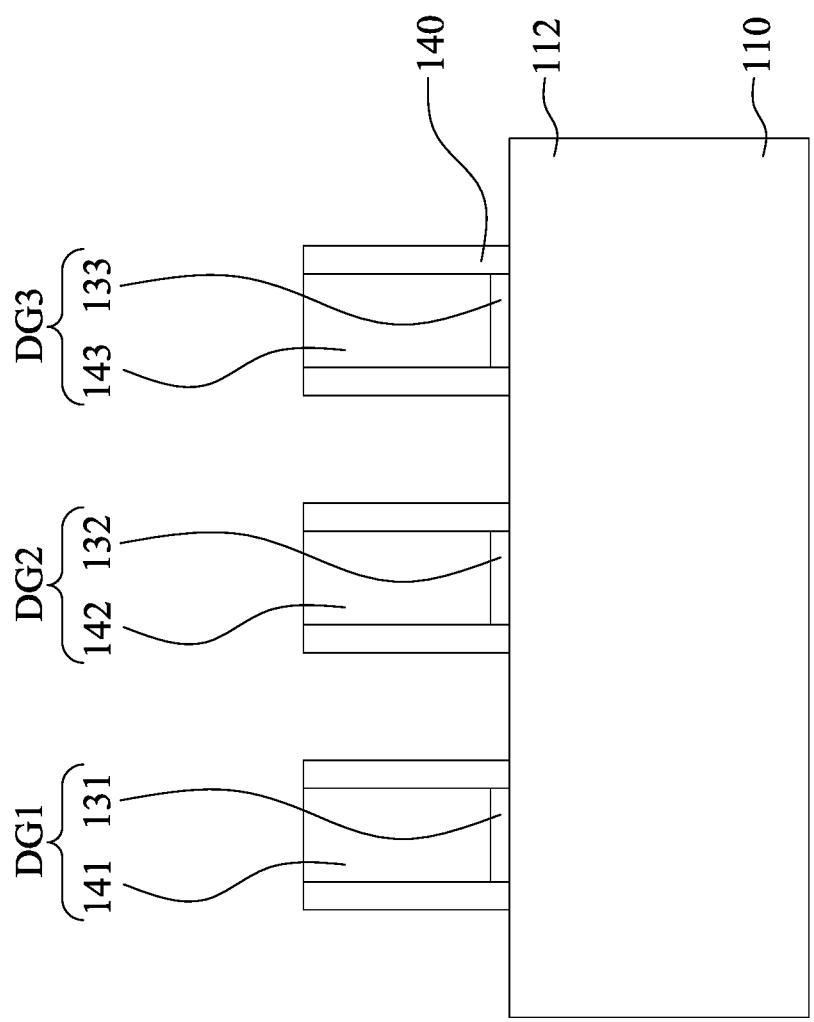
Figure 3C:
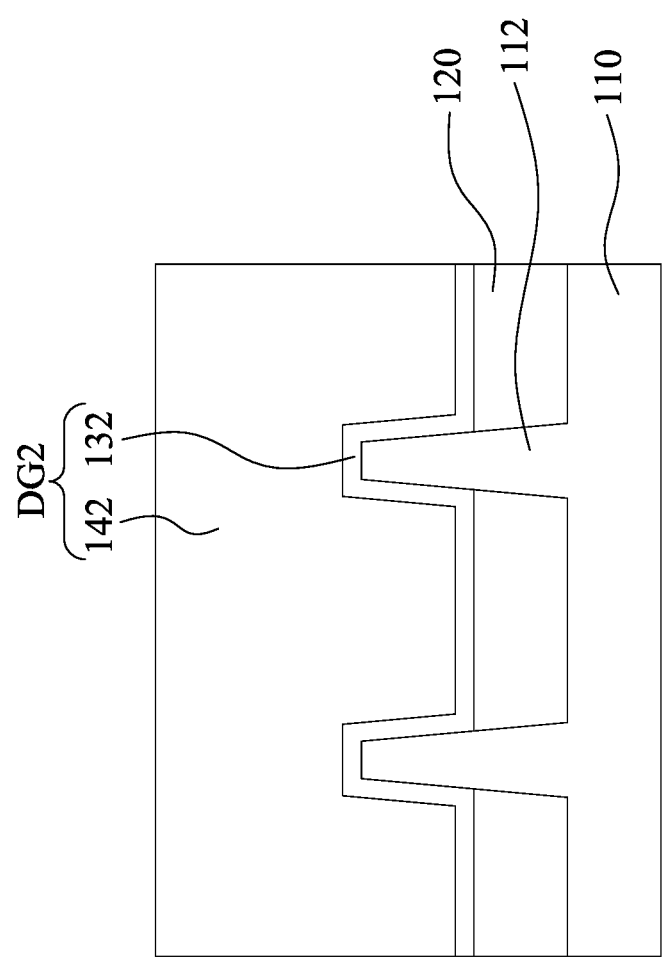

Reference is made to FIGS. 3A to 3C. FIG. 3B is a cross-sectional view taken along line 3B-3B in FIG. 3A. FIG. 3C is a cross-sectional view taken along line 3C-3C in FIG. 3A. A plurality of gate spacers 140 are formed respectively on opposite sidewalls of the dummy gate stacks DG1, DG2, and DG3. In some embodiments, at least one of the gate spacers 140 includes single or multiple layers. The gate spacers 140 can be formed by blanket depositing one or more dielectric layer(s) (not shown) on the structure shown in FIG. 2. The dielectric layer(s) may include silicon nitride (SiN), oxynitride, silicion carbon (SiC), silicon oxynitride (SiON), oxide, and the like. The dielectric layer(s) may be formed by methods such as CVD, plasma enhanced CVD, sputter, or the like. The dielectric layer(s) may then be patterned, such as by one or more etch processes (e.g. anisotropic etching) to remove horizontal portions of the dielectric layer(s) from the horizontal surfaces of the structure, and the remaining portions of the dielectric layer(s) are referred to gate spacers 140.

Figure 4A:
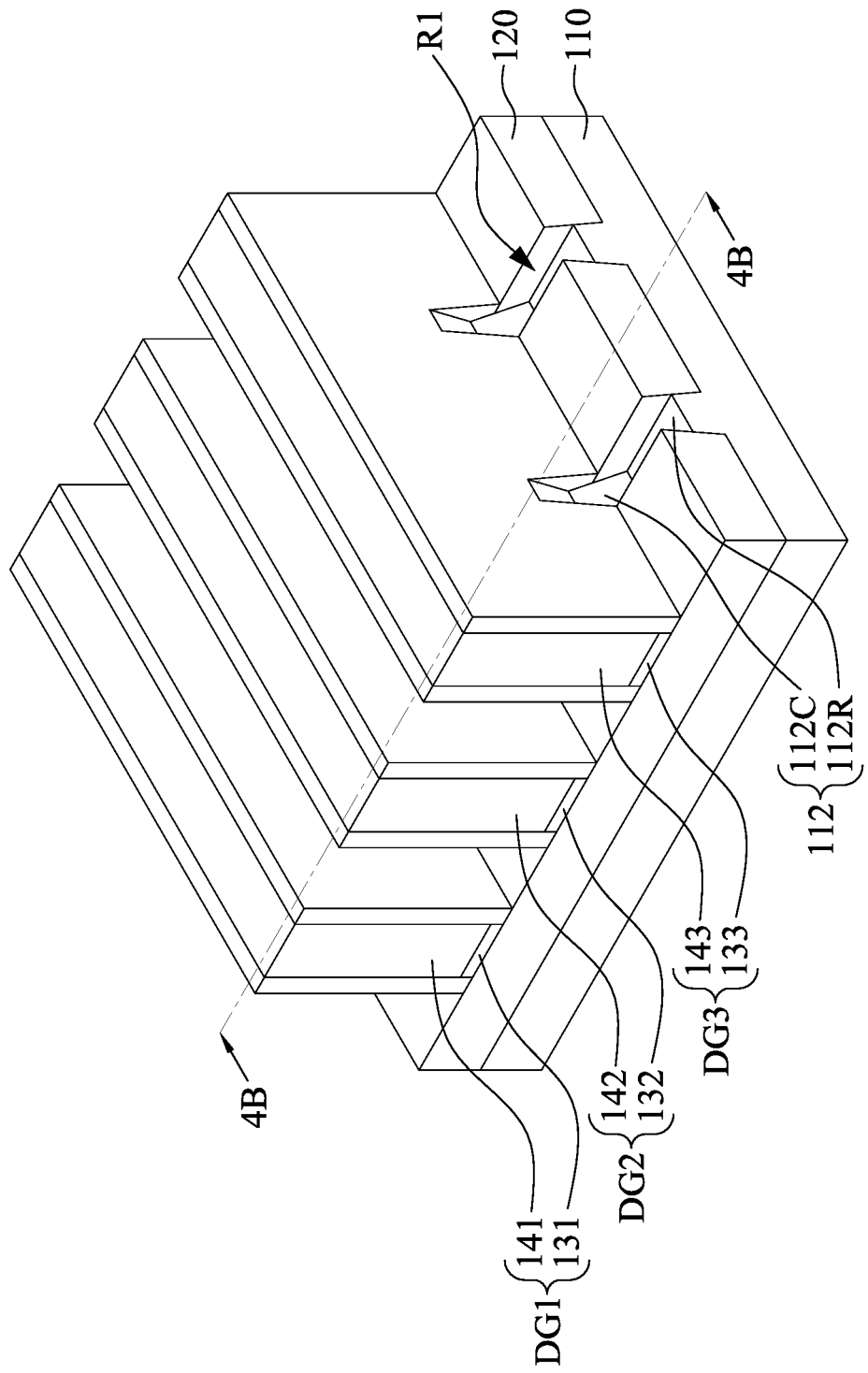
Figure 4B:
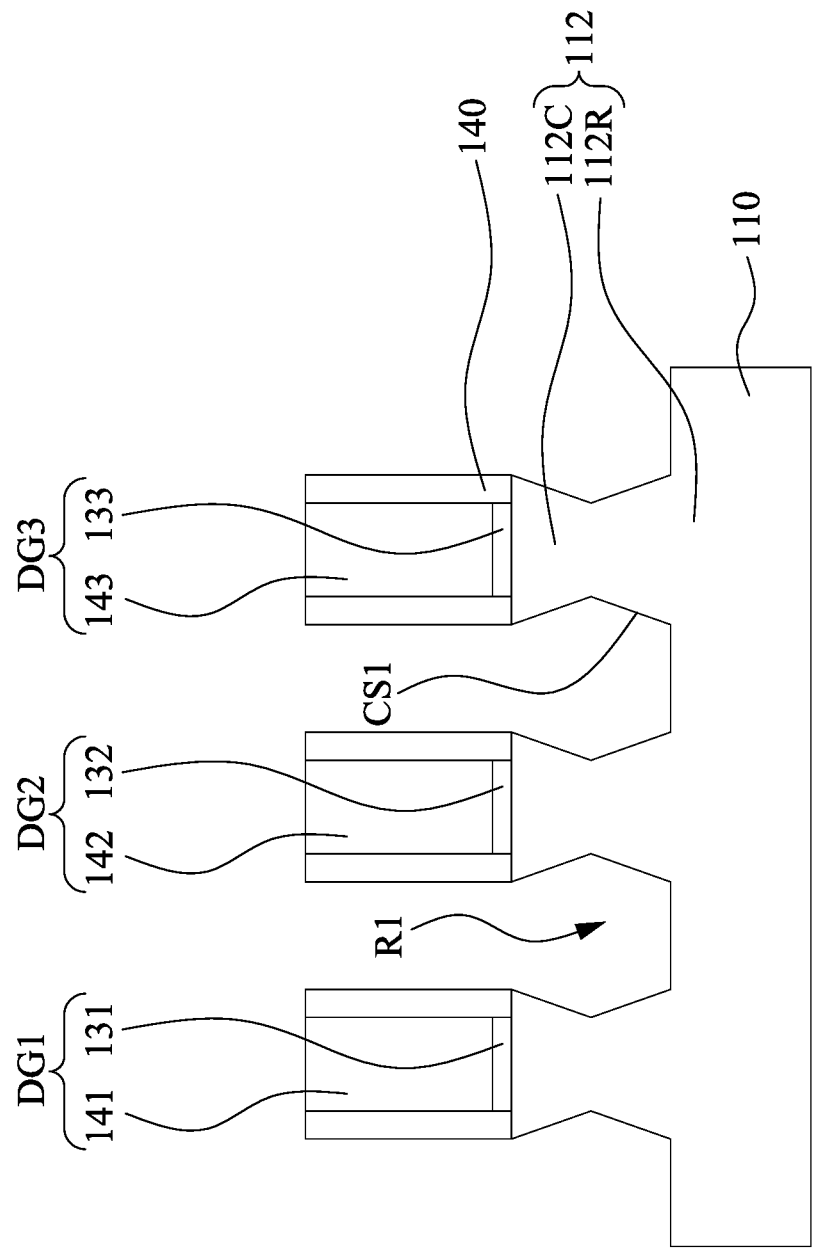

Reference is made to FIGS. 4A and 4B. FIG. 4B is a cross-sectional view taken along line 4B-4B in FIG. 4A. Portions of the semiconductor fins 112 uncovered by the dummy gate stacks DG1, DG2, and DG3 are removed, such that each of the remaining semiconductor fins 112 include a recessed portion 112R uncovered by the dummy gate stacks DG1, DG2, and DG3 and a channel portion 112C covered by the dummy gate stacks DG1, DG2, and DG3, respectively.

Herein, a plurality of recesses R1 are formed in the semiconductor fins 112 of the substrate 110. In some embodiments, the recesses R1 may have a substantially diamond-shaped profile, as shown in FIG. 4B. That is, some sidewalls of the recesses R1 extend towards a position vertically below the gate spacers 140, such that the channel portions 112C have facet sidewalls CS1 vertically below the gate spacers 140. In some other embodiments, the recesses R1 may have a substantially U-shaped profile (not shown), and a sidewall of the recess R1 can be substantially aligned with the edge (or outer boundary) of the gate spacer 140. That is, the sidewalls CS1 of the channel portions 112C may be vertical and aligned with the edge (or outer boundary) of the gate spacer 140. In some other embodiments, the recesses R1 may have a semi-elliptical-like shape, a rectangular-like shape or irregular shapes.

The removal of the semiconductor fins 112 may include a dry etching process, a wet etching process, or combination of dry and wet etching processes. The recessing process may also include a selective wet etch or a selective dry etch. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching). In some embodiments, the substantially diamond-shaped recesses R1 can be formed with an etching process that includes dry etching and wet etching processes where etching parameters thereof are tuned (such as etchants used, etching temperature, etching solution concentration, etching pressure, source power, radio frequency (RF) bias voltage, RF bias power, etchant flow rate, and other suitable parameters) to achieve the predetermined recess profile. After the etching process, a pre-cleaning process may be performed to clean the recesses R1 with hydrofluoric acid (HF) or other suitable solution in some embodiments.

Figure 5A:
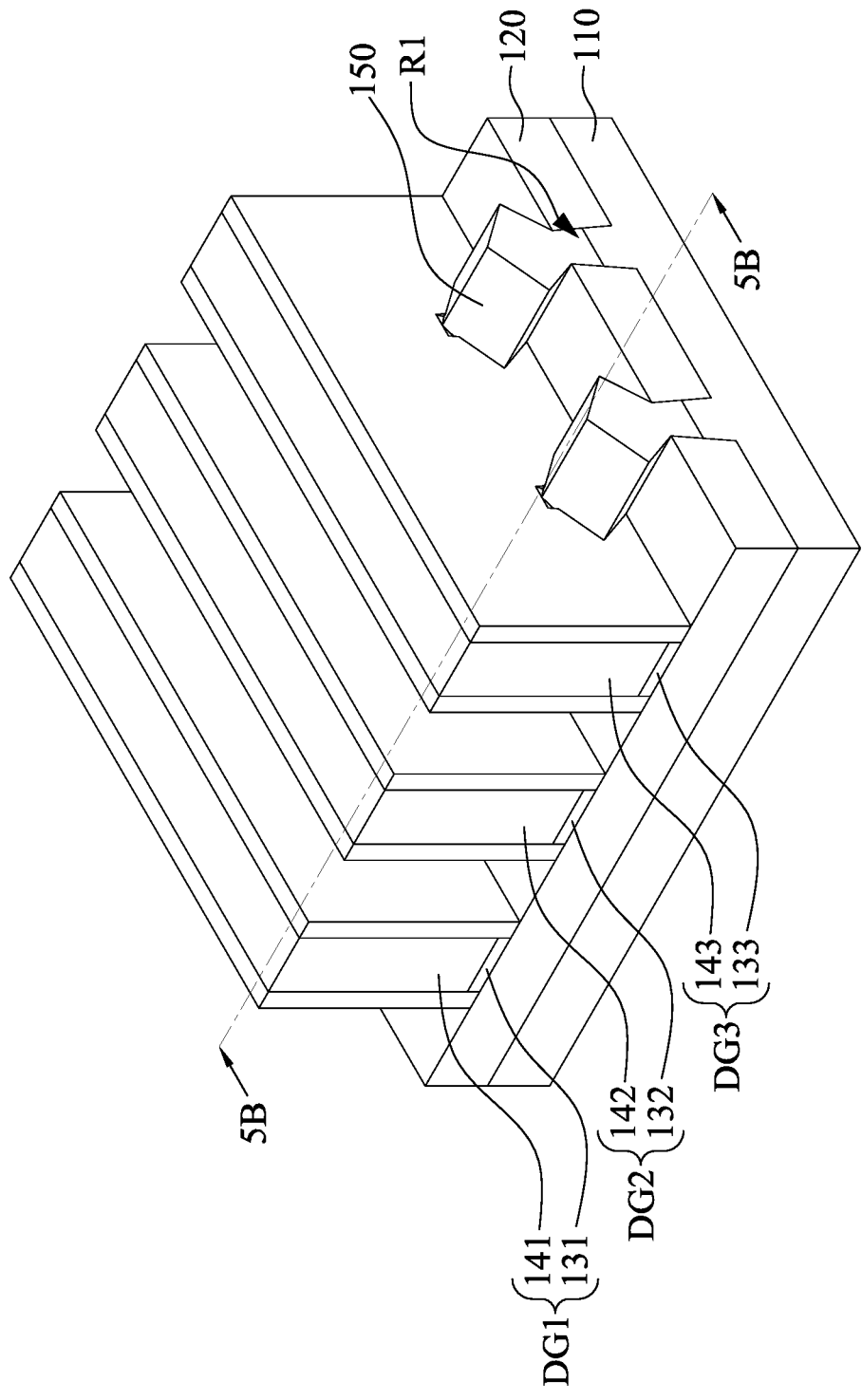
Figure 5B:
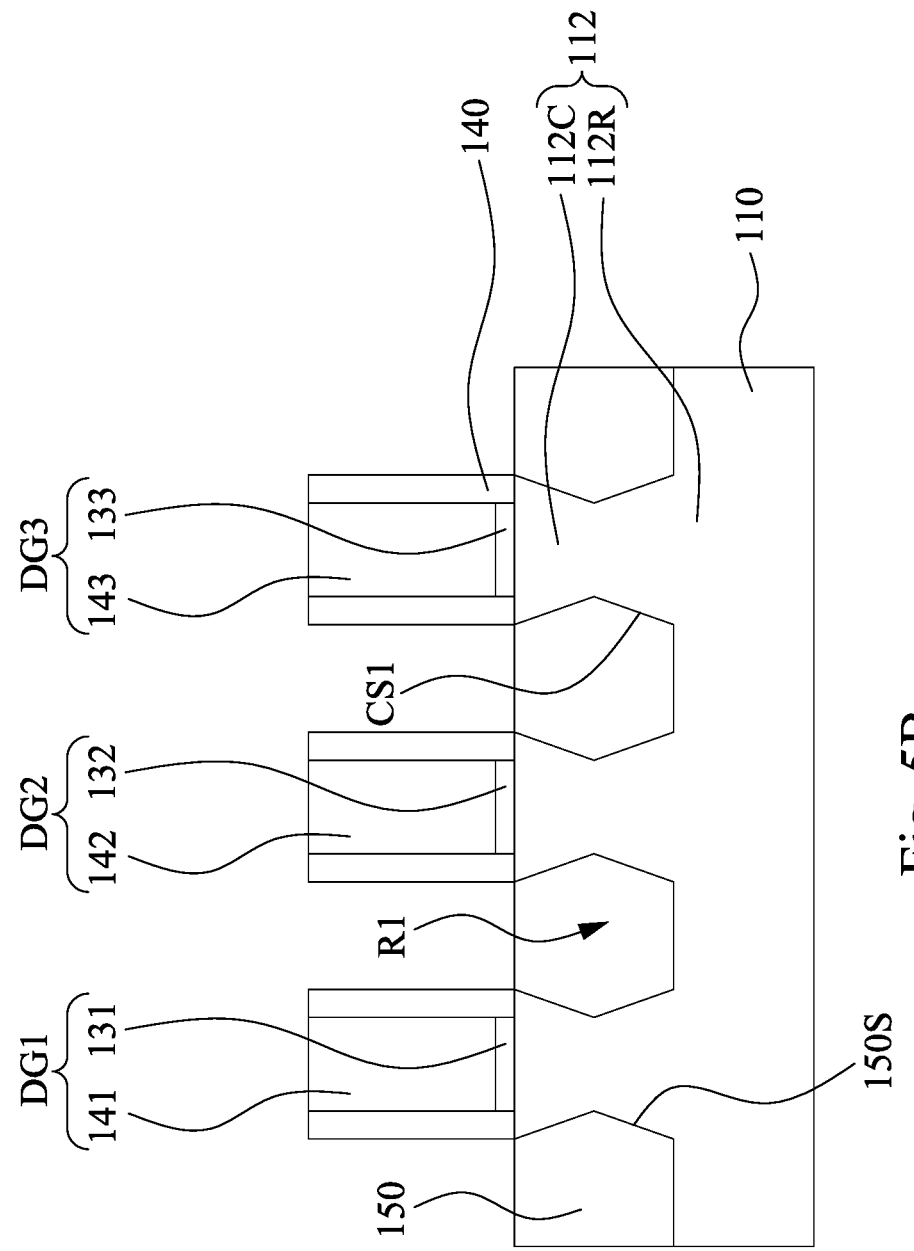

Reference is made to FIGS. 5A and 5B. FIG. 5B is a cross-sectional view taken along line 5B-5B in FIG. 5A. A plurality of source/drain features 150 are respectively formed in the recesses R1 of the semiconductor fins 112 of the substrate 110. At least one of the source/drain features 150 is formed between the dummy gate stacks DG1 and DG2, and at least one of the source/drain features 150 is formed between the dummy gate stacks DG2 and DG3. In FIG. 5B, sidewalls 150S of the source/drain features 150 extend to a position vertically below the gate spacers 140 and may be in contact with the sidewalls CS of the channel portions 112C.

In some embodiments, the source/drain features 150 may be epitaxy structures, and may also be referred to as epitaxy features 150. The source/drain features 150 may be formed using one or more epitaxy or epitaxial (epi) processes, such that Si features, SiGe features, and/or other suitable features can be formed in a crystalline state on the semiconductor fins 112. In some embodiments, lattice constants of the source/drain features 150 are different from lattice constants of the semiconductor fins 112, such that channels in the channel portions 112C of the semiconductor fins 112 are strained or stressed to enable carrier mobility of the semiconductor device and enhance the device performance. In some embodiments, the source/drain features 150 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon). The source/drain features 150 may be in-situ doped. The doping species include P-type dopants, such as boron or $BF_2$; N-type dopants, such as phosphorus or arsenic; and/or other suitable dopants including combinations thereof. The source/drain features 150 abutting the dummy gate stack DG2 may be doped with dopants of the same or different conductive types. If the source/drain features 150 are not in-situ doped, a second implantation process (i.e., a junction implant process) is performed to dope the source/drain features 150. One or more annealing processes may be performed to activate the source/drain features 150. The annealing processes include rapid thermal annealing (RTA) and/or laser annealing processes.

Figure 6A:
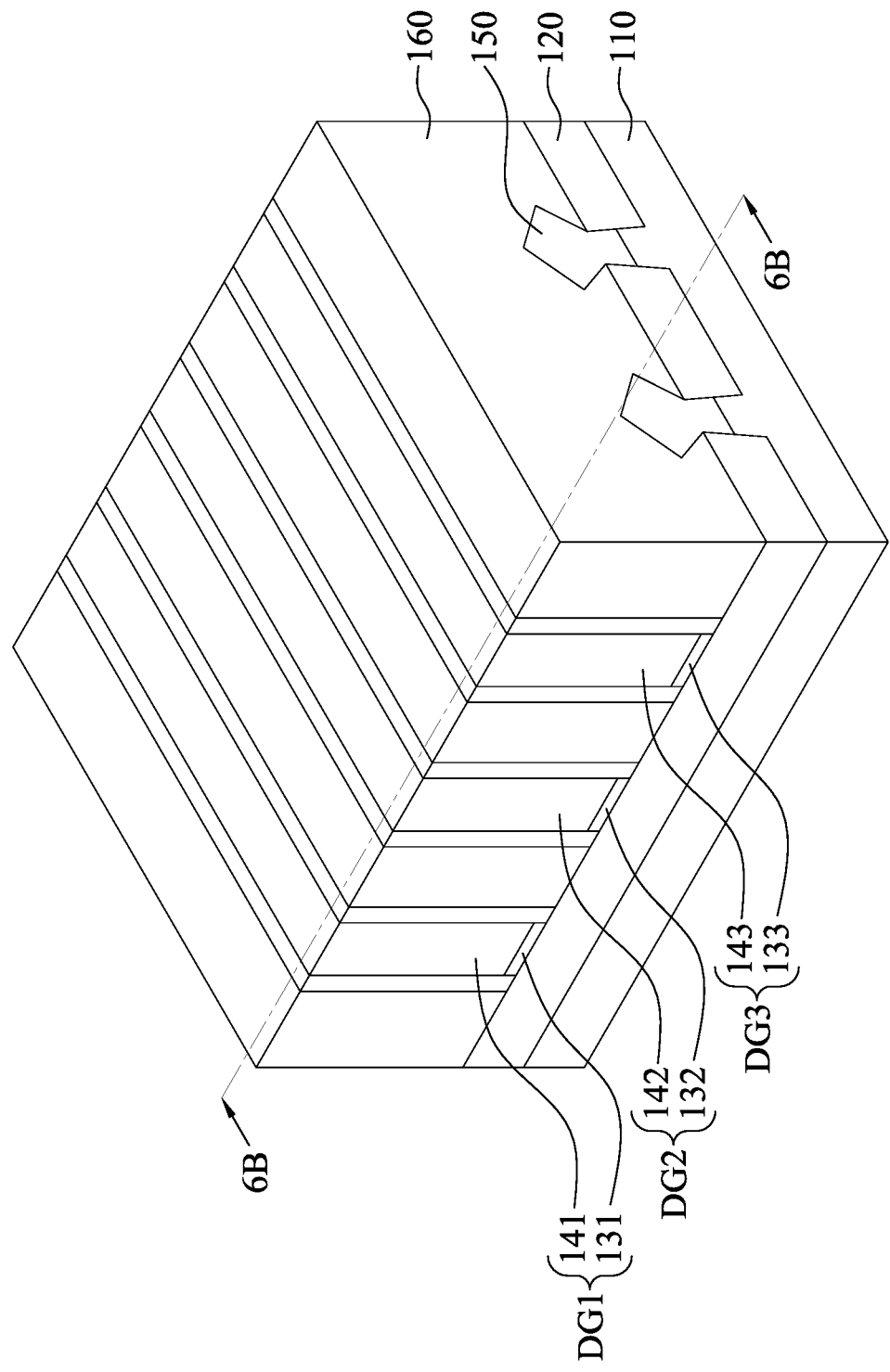
Figure 6B:
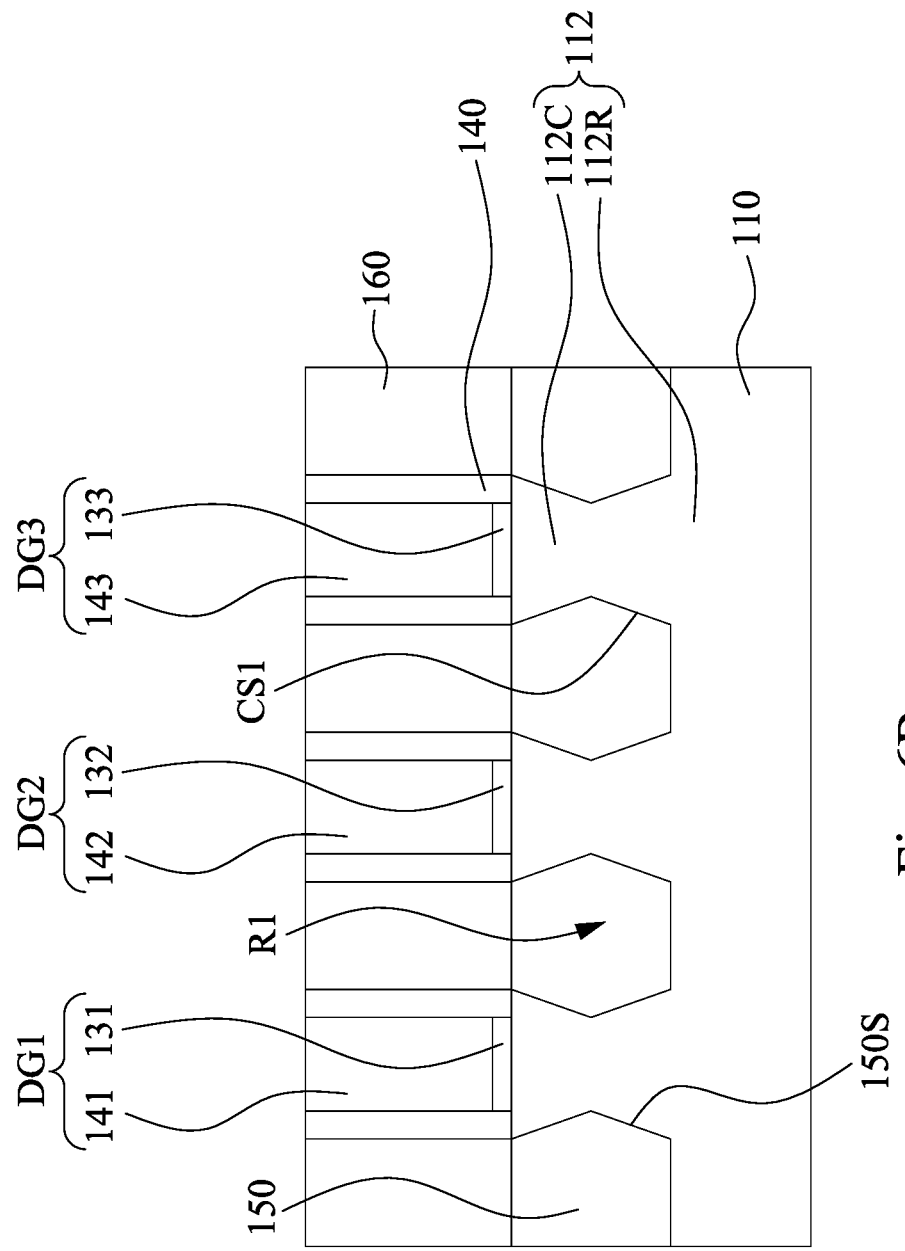

Reference is made to FIGS. 6A and 6B. FIG. 6B is a cross-sectional view taken along line 6B-6B in FIG. 6A. After the source/drain features 150 are formed, an interlayer dielectric (ILD) 160 is formed over the substrate 110 and surrounding the source/drain features 150. The ILD 160 may include silicon oxide, oxynitride or other suitable materials. The ILD 160 includes a single layer or multiple layers. The ILD 160 can be formed by a suitable technique, such as CVD or ALD. A chemical mechanical polishing (CMP) process may be performed to remove an excess portion of the ILD 160 until reaching the dummy gate stacks DG1, DG2, and DG3. After the chemical mechanical planarization (CMP) process, the dummy gate stacks DG1, DG2, and DG3 are exposed from the ILD 160. In some embodiments, a contact etch stop layer (CESL) may be blanket formed over the substrate 110 prior to the formation of the ILD 160.

Figure 7A:
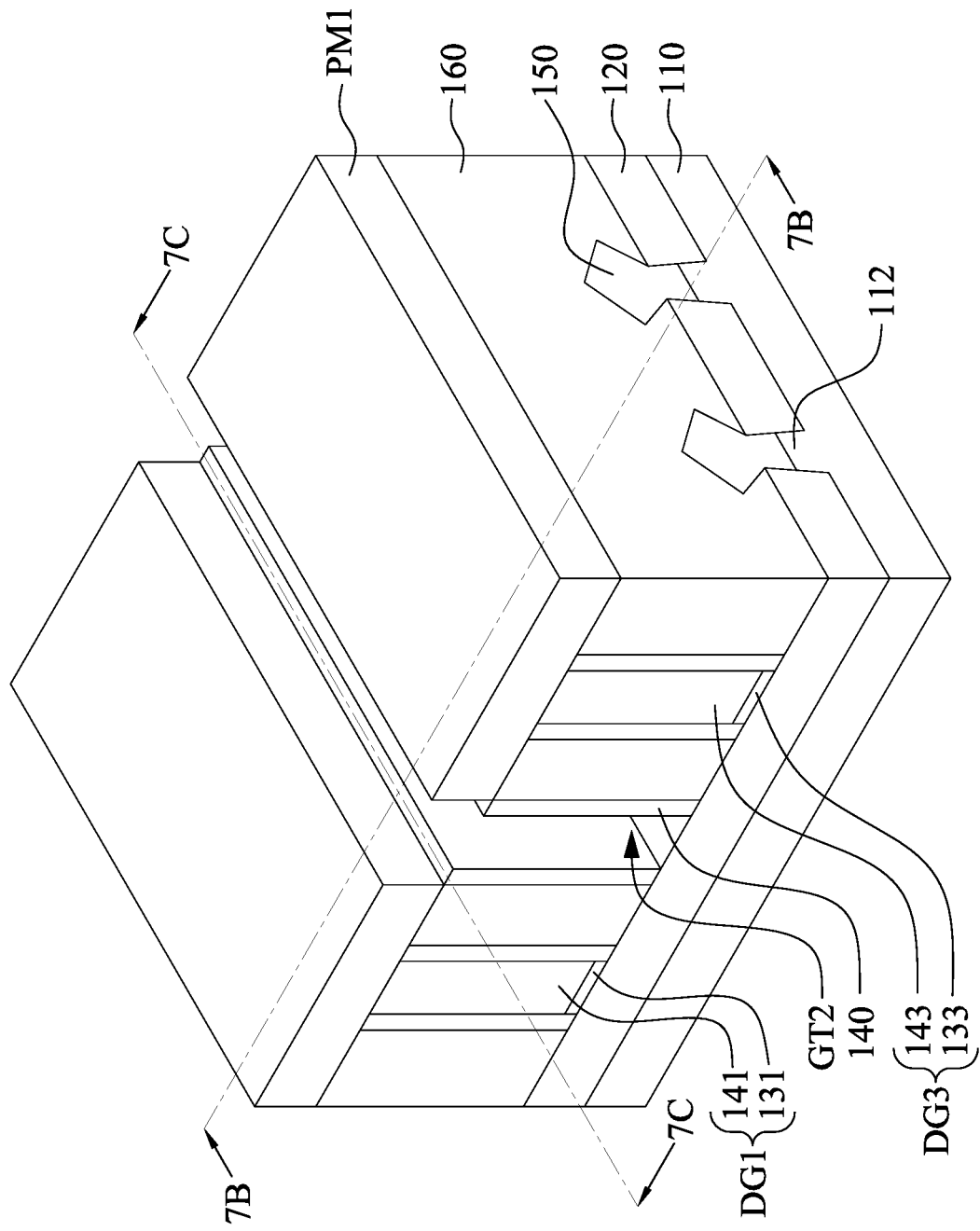
Figure 7B:
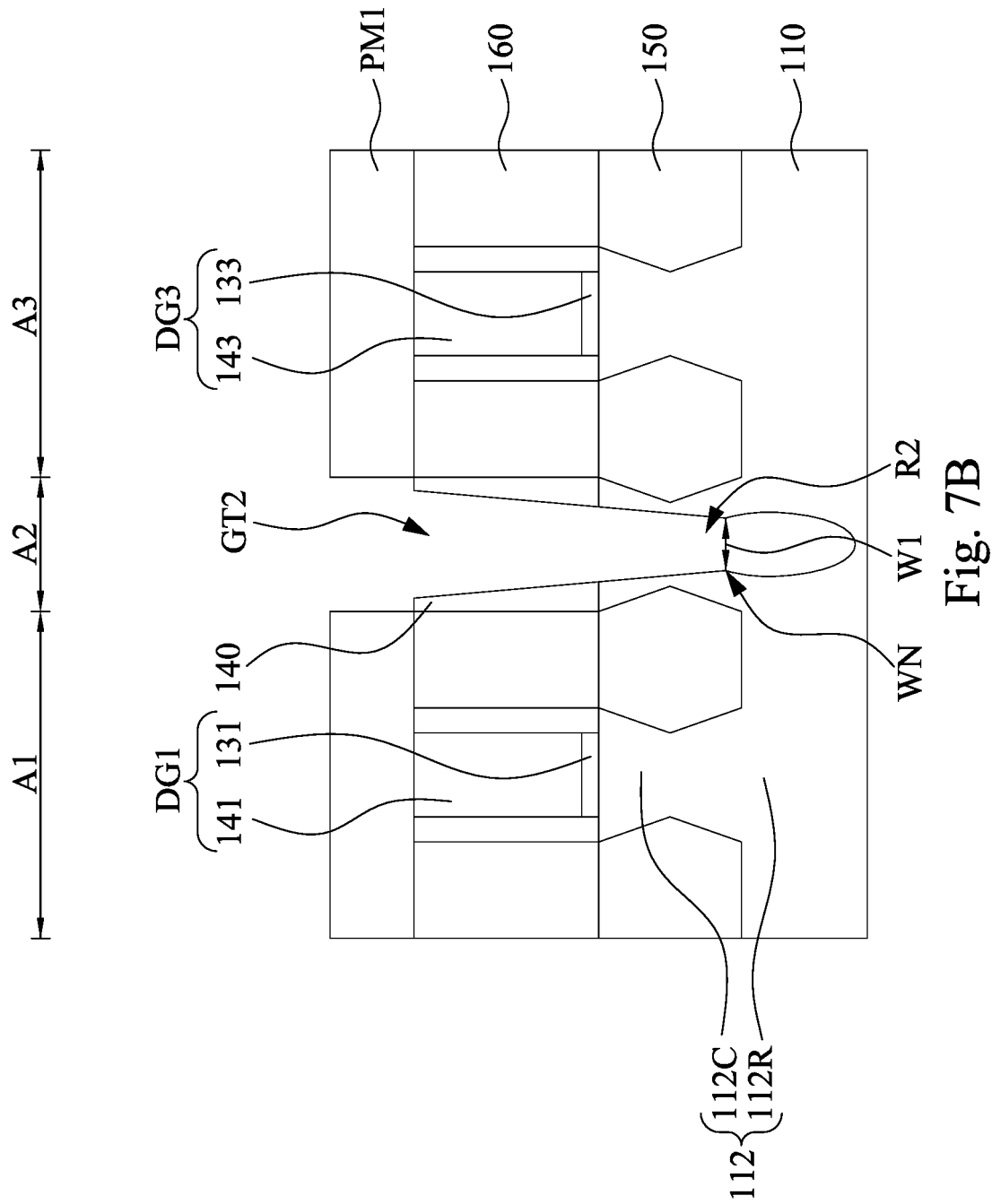
Figure 7C:
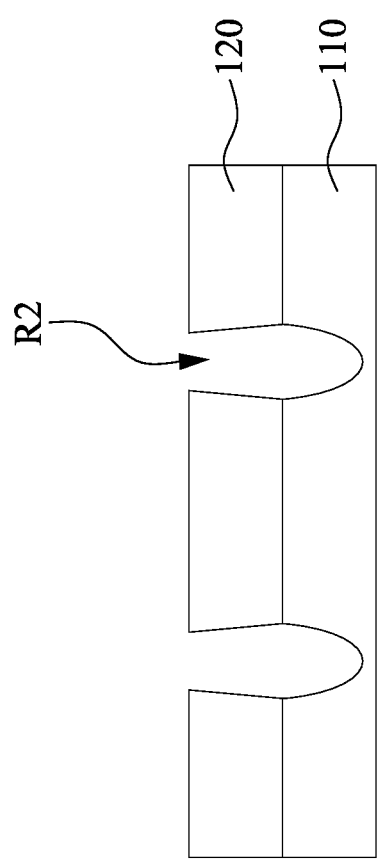

Reference is made to FIGS. 7A to 7C. FIG. 7B is a cross-sectional view taken along line 7B-7B in FIG. 7A. FIG. 7C is a cross-sectional view taken along line 7C-7C in FIG. 7A. A patterned mask PM1 is formed over the ILD 160 of the substrate 110 and the dummy gates DG1 and DG3 to define two masked regions A1 and A3 and an unmasked region A2. In other words, the patterned mask PM1 exposes the dummy gate stack DG2 (see FIG. 6B) in the unmasked region A2, and the dummy gate stacks DG1 and DG3 in the masked regions A1 and A3 are covered by the patterned mask PM1.

Then, one or more etching processes are performed through the patterned mask PM1 to remove the dummy gate stack DG2 (see FIGS. 6A and 6B). After the dummy gate stack DG2 is removed, a gate trench GT2 is formed in between the gate spacers 140, and a portion of the channel portion 112C of the semiconductor fins 112 is exposed by the gate trench GT2. Thereafter, an etching process is then performed to the exposed semiconductor fin 112 to recess the semiconductor fin 112. A recess R2 is formed in the substrate 110. In some embodiments, the recess R2 may penetrate the semiconductor fin 112. For example, the recess R2 may have a bottom lower than a bottom surface of the isolation structures 120. As a result of the etching processes performed to the unmasked region A2, the recess R2 in the substrate 110 is vertically below and spatially communicated with the gate trench GT2.

In some embodiments, the etching process for recessing the semiconductor fin 112 may be anisotropic etching, such as plasma etching. One or more etching parameters of this etching process are tuned to control the profile of the recess R2 in the substrate 110. In some embodiments, the etching parameters include total pressure of etch gas(es), partial pressure of oxygen in the etch gases, radio frequency (RF) bias voltage, RF bias power, the like or combinations thereof. As a result of the tuned etching parameters, the recess R2 has a bowling-like cross-sectional profile. For example, the recess R2 includes a waist WN having a width W1, in which the width W1 is less than widths of other portions of the recess R2 above or below the waist WN. In some embodiments, the waist WN is the narrowest portion of the recess R2. Moreover, the width W1 of the waist WN of the recess R2 is less than a width of the gate trench GT2.

The waist WN of the recess R2 is in a position higher than a bottom of the neighboring source/drain feature 150. As a result, the waist WN of the recess R2 is in between two neighboring source/drain features 150. Therefore, even if the source/drain features 150 laterally extend to positions below the gate spacers 140, etching of the recess R2 will not affect the source/drain features 150. For example, a shortest distance between the neighboring diamond-shaped source/drain features 150 is greater than the width W1 of the waist WN. In this way, the source/drain features 150 proximate the recess R2 will be free of damage during the etching of the recess R2 even if the diamond-shaped profile results in considerable lateral extensions of the source/drain features 150.

Moreover, a lower portion of the recess R2 below the waist WN can be wider than the waist WN due to the tuned etching parameters, and hence creating the waist WN will not unduly shrink the lower portion of the recess R2. As a result, the lower portion of the recess R2 can be kept in a moderate size such that a dielectric plug subsequently formed in the recess R2 can provide sufficient isolation to the source/drain features 150 on opposite sides of the recess R2.

In some embodiments, the one or more etching processes that removes the dummy gate stack DG2 may be a selective etch process, including a selective wet etch or a selective dry etch, and carries a substantially vertical profile of the gate spacers 140. With the selective etch process, the gate trench GT2 is formed with a self-alignment nature, which relaxes process constrains, such as misalignment, and/or overlay issue in lithograph process, recess profile controlling in etch process, pattern loading effect, and etch process window.

Figure 8A:
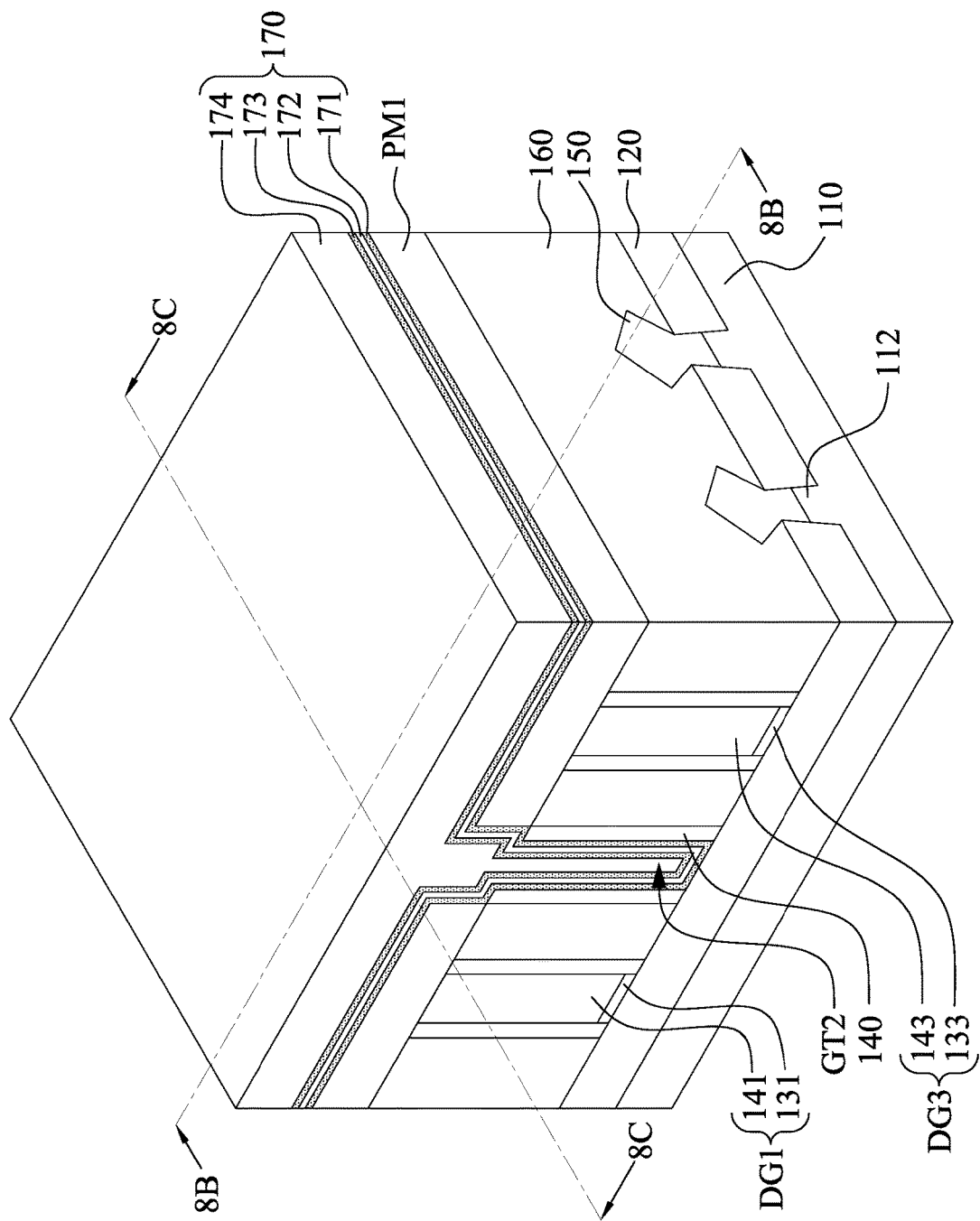
Figure 8B:
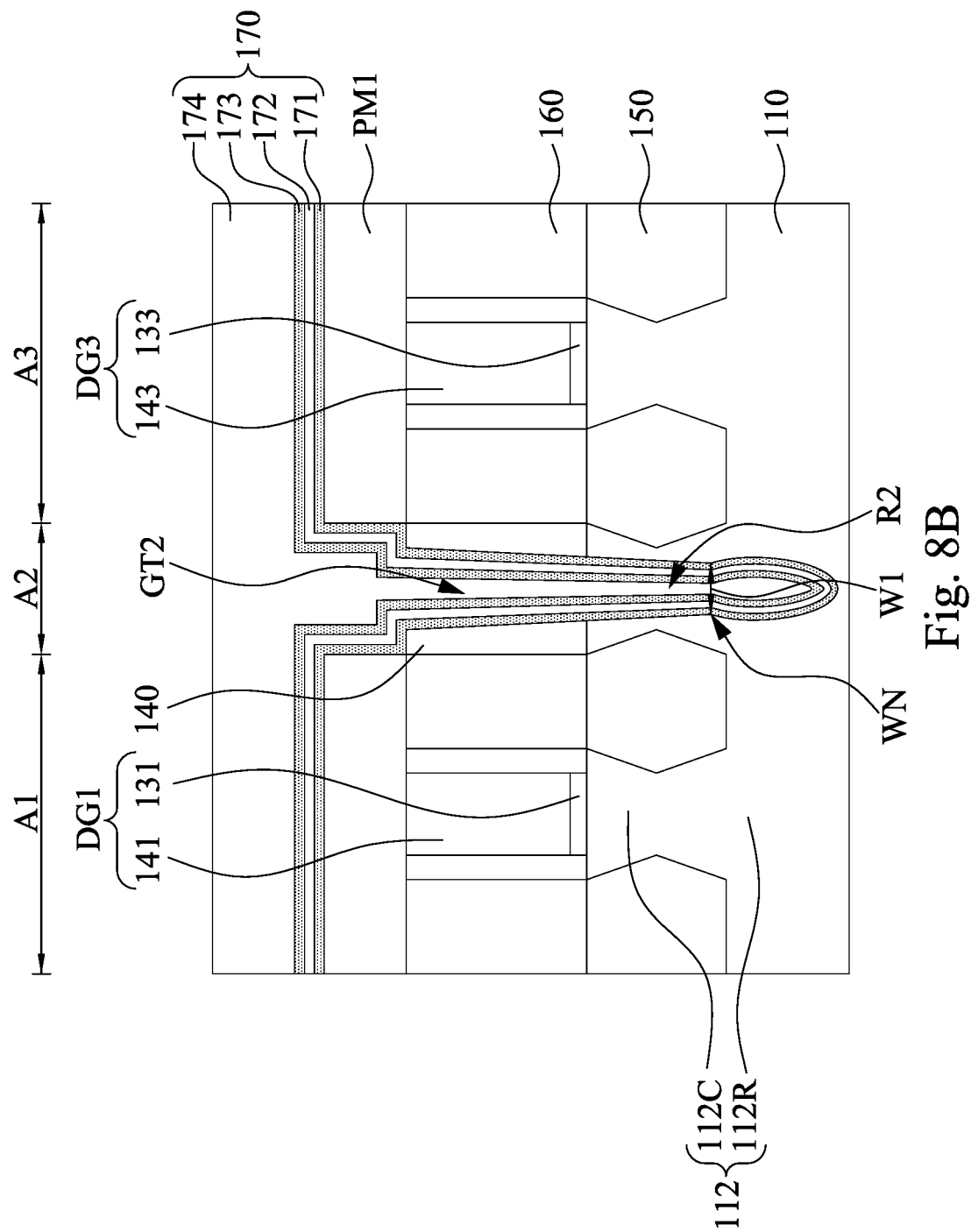
Figure 8C:
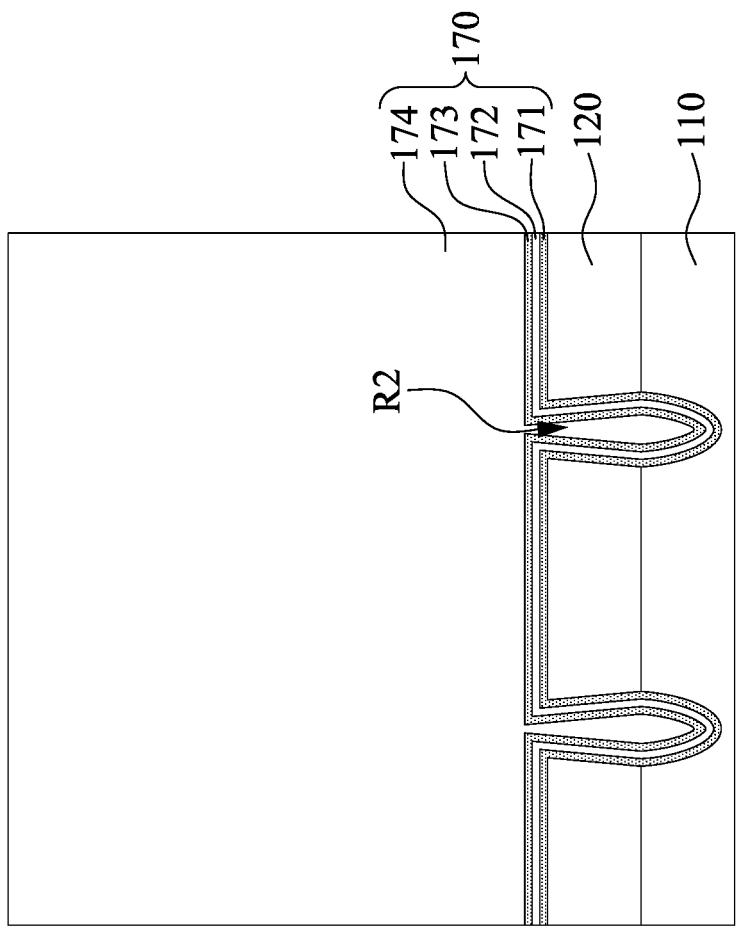

Reference is made to FIGS. 8A to 8C. FIG. 8B is a cross-sectional view taken along line 8B-8B in FIG. 8A. FIG. 8C is a cross-sectional view taken along line 8C-8C in FIG. 8A. A dielectric stacked layer 170 is formed over the patterned mask PM1 and filling the gate trench GT2 and the recess R2. The dielectric stacked layer 170 includes plural dielectric layers 171-174 conformally formed in the gate trench GT2 and the recess R2. For example, the dielectric layer 171 is conformally formed in the gate trench GT2 and the recess R2, the dielectric layer 172 is conformally over the dielectric layer 171, the dielectric layer 173 is conformally over the dielectric layer 172, and the dielectric layer 174 is conformally over the dielectric layer 173. In some embodiments of the present disclosure, at least two of the dielectric layers 171-174 include different materials, such as $SiO_2$, SiON, SiCN, $Si_3N_4$, SiOCN, or combinations thereof. For example, in some embodiments, the dielectric layers 171 and 173 include SiON, and the dielectric layer 172 and 174 may include $SiO_2$. The SiON layers are interlaced with the $SiO_2$ layers. In some embodiments, the dielectric layers 171 and 173 include $Si_3N_4$, and the dielectric layer 172 and 174 may include $SiO_2$. The $Si_3N_4$ layers are interlaced with the $SiO_2$ layers. Alternatively, in some other embodiments, the dielectric layers 171-174 are made of different materials. The dielectric layers 171-174 may be formed by a suitable technique, such as CVD, ALD and spin-on coating. In some embodiments, air gaps may be created among the dielectric layers 171-174. At least two of the dielectric layers 171-174 may have different thickness. In some embodiments, at least two of the dielectric layers 171-174 may have the same thickness. Although the dielectric stacked layer 170 is depicted as having four dielectric layers, it should not limit the scope of the present disclosure. The dielectric stacked layer 170 may include more or less than four dielectric layers.

Figure 9A:
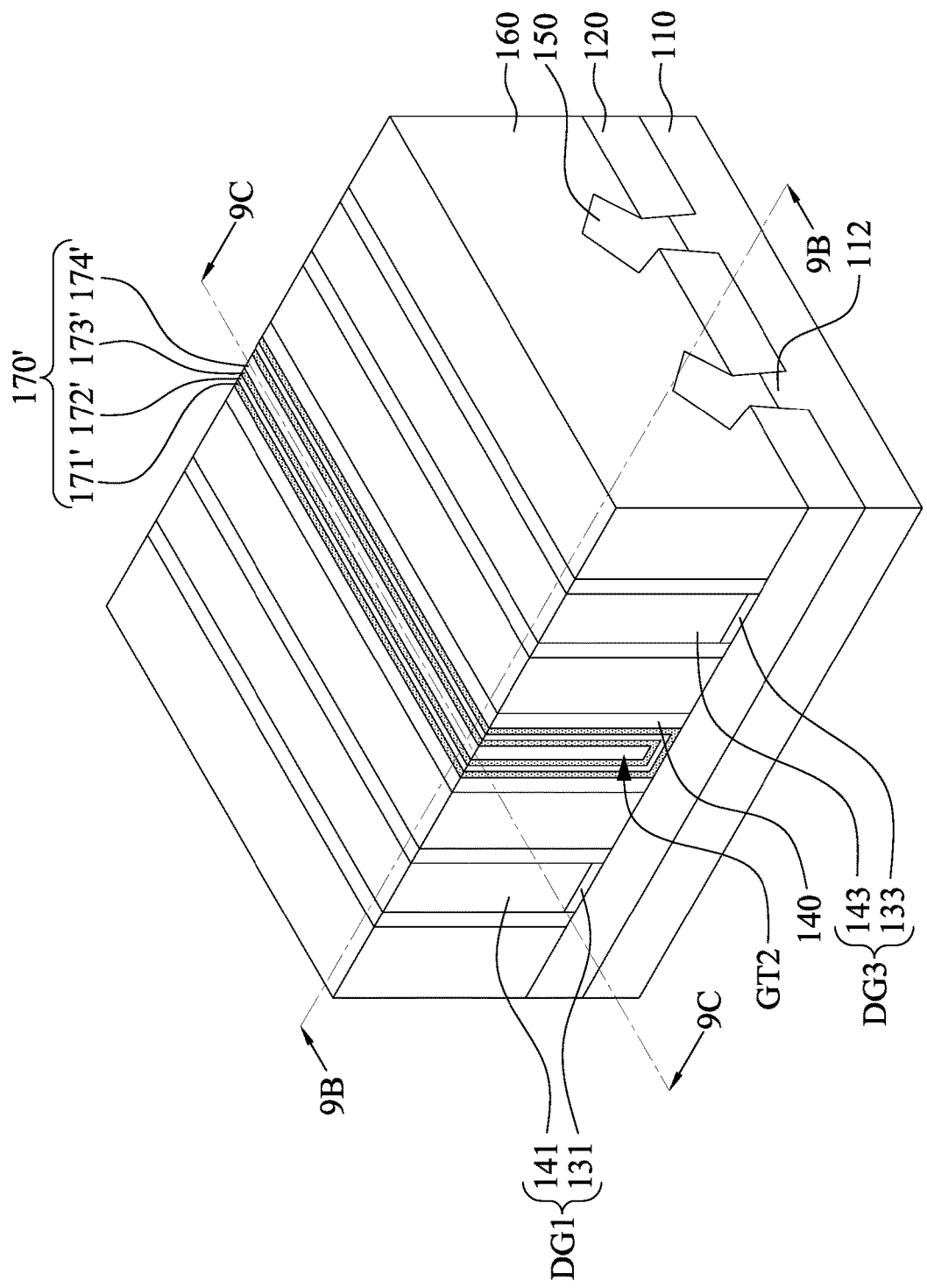
Figure 9B:
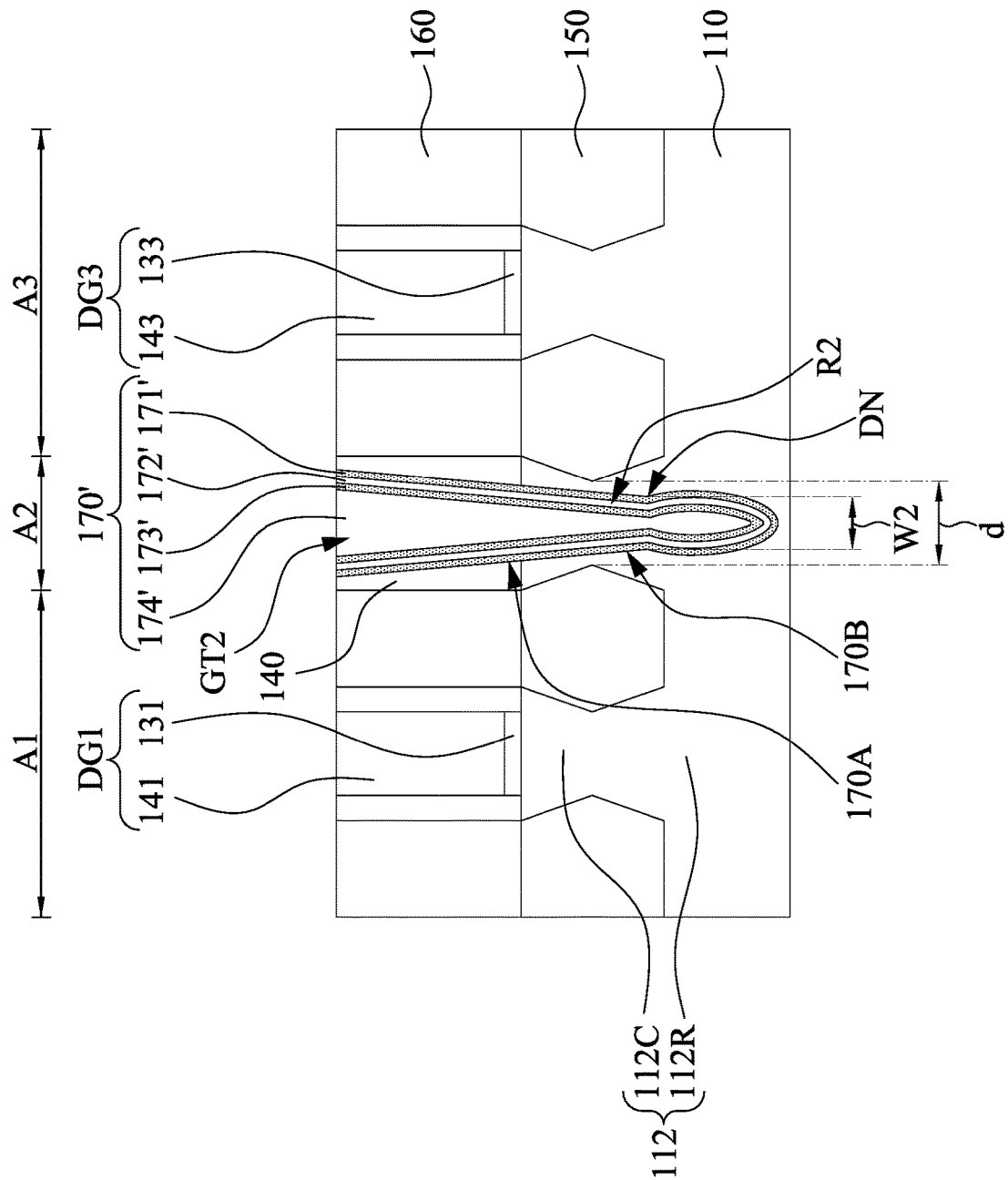

Reference is made to FIGS. 9A to 9C. FIG. 9B is a cross-sectional view taken along line 9B-9B in FIG. 9A. FIG. 9C is a cross-sectional view taken along line 9C-9C in FIG. 9A. A planarization process, such as a chemical mechanical polish (CMP) process, is performed to the dielectric stacked layer 170 until the dummy gate stacks DG1 and DG3 are exposed. The planarization process removes the patterned mask PM1 and planarizes the top surface of the dielectric layers 171-174 of the dielectric stacked layer 170 with the dummy gate stacks DG1 and DG3, such that the top surfaces of the dummy gate stacks DG1 and DG3 are substantially level with the top surfaces of the remaining dielectric layers (e.g. dielectric portions 171'-174'). The remaining dielectric stacked layer can be referred to as a dielectric plug 170', which is embeddedly retained in the gate trench GT2 and the recess R2. In other words, the dummy gate stack DG2 (see FIGS. 6A and 6B) is replaced by the dielectric plug 170'. The dielectric plug 170' includes the dielectric portions 171'-174', which are formed from the dielectric layers 171-174 (see FIGS. 8A and 8B), respectively.

Herein, one dielectric portion may wrap around another dielectric portion. For example, the dielectric portion 173' wraps around the dielectric portion 174'. The dielectric portion 172' wraps around the dielectric portion 173'. The dielectric portion 171' wraps around the dielectric portion 172'. Four layers of dielectric portions 171'-174' are illustrated herein. However, the number of the layers of dielectric portions of the dielectric plug 170' should not be limited thereto. The dielectric plug 170' may include greater or less than four layers of dielectric portions.

The dielectric plug 170' includes a first portion 170A and a second portion 170B connected with the first portion 170A. The first portion 170A is in the gate trench GT2, and the second portion 170B is in the recess R2 and below the first portion 170A. The first portion 170A protrudes from the semiconductor fins 112, and the second portion 170B is embedded in the semiconductor fins 112. The first portion 170A is above the top surface 110S of the semiconductor fin 112. The first portion 170A is in between the gate spacers 140. The first portion 170A and the second portions 170B both include the dielectric portions 171'-174'.

The second portion 170B may have similar shape with that of the recess R2. For example, the second portion 170B includes a waist DN having a width W2, in which the width W2 of the waist DN is less than widths of other portions of the dielectric plug 170' above or below the waist DN. For example, the width W2 is less than a width of a portion of the dielectric plug 170' below the waist DN and a width of a portion of the dielectric plug 170' above the waist DN. That is, the waist DN is the narrowest portion of the dielectric plug 170'. In some embodiments, the waist DN of the second portion 170B of the dielectric plug 170' is in between the source/drain features 150. The source/drain features 150 extend to positions vertically below the spacers 140, respectively. The width W2 of the waist DN is less than a distance d between the two neighboring source/drain features 150. The distance d is the shortest distance between the two neighboring source/drain features 150. In some other embodiments, portions of the dielectric plug 170' above or below the waist DN may have a width greater than the distance d between the two neighboring source/drain features 150, so as to provide good isolation between two neighboring source/drain features 150. In some embodiments, the spacers 140 abutting the dielectric plug 170' include materials the same as that of the gate spacers 140 abutting the dummy gate stacks DG1 and DG3 since they are formed from the same dielectric layer(s).

Figure 10A:
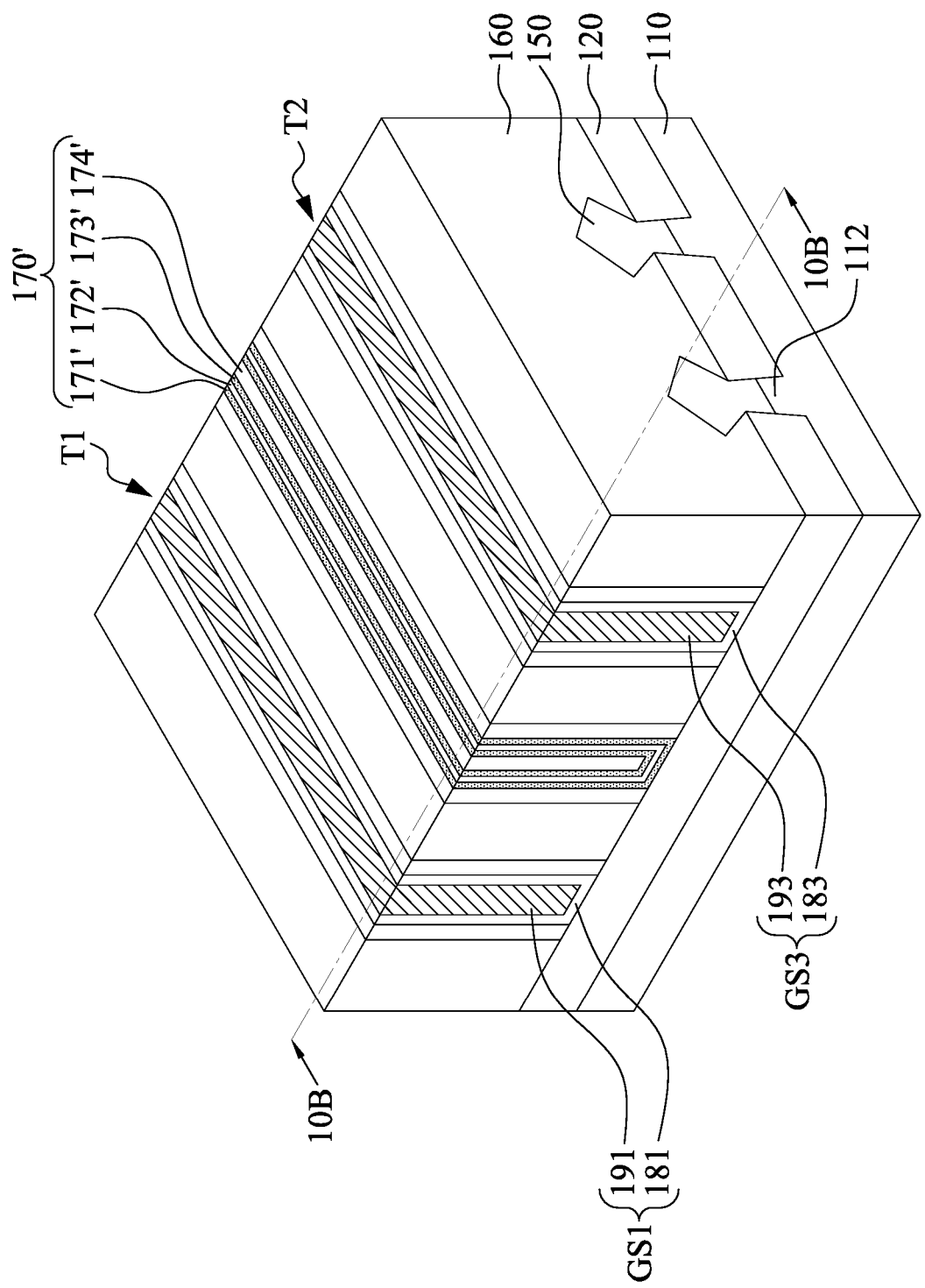
Figure 10B:
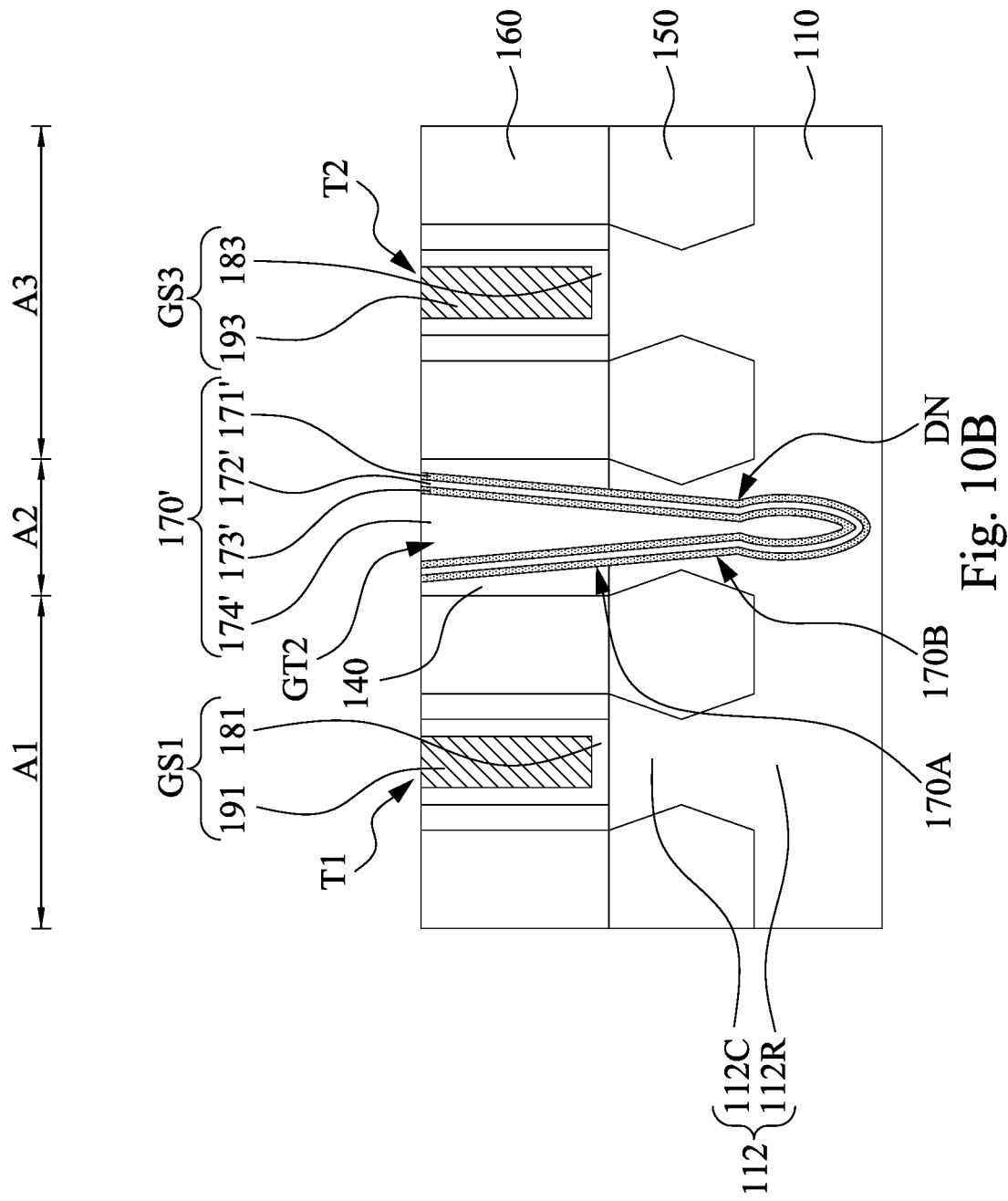

Reference is made to FIGS. 10A and 10B. FIG. 10B is a cross-sectional view taken along line 10B-10B in FIG. 10A. A replacement gate (RPG) process scheme is employed. The dummy gate stack DG1 is replaced with a gate stack GS1, and the dummy gate stacks DG3 is replaced with a gate stack GS3. For example, the dummy gate stacks DG1 and DG3 (see FIGS. 9A and 9B) are removed to form a plurality of gate trenches. The dummy gate stacks DG1 and DG3 are removed by a selective etch process, including a selective wet etch or a selective dry etch, and carries a substantially vertical profile of the gate spacers 140. The gate trenches expose portions of the semiconductor fins 112 of the substrate 110. Then, the gate stacks GS1 and GS3 are formed respectively in the gate trenches and cover the semiconductor fins 112 of the substrate 110. The gate stack GS1 includes a gate dielectric 181 and a metal-containing layer 191 over the gate dielectric 181, and the gate stack GS3 includes a gate dielectric 183 and a metal-containing layer 193 over the gate dielectric 183. In some embodiments, the top surfaces of the gate stacks GS1 and GS3 are substantially level with the top surface of the dielectric plug 170'.

The gate dielectrics 181 and 183, as used and described herein, include dielectric materials having a high dielectric constant, for example, greater than that of thermal silicon oxide (~3.9). The gate dielectrics 181 and 183 may include a high-K dielectric layer such as tantalum, hafnium, titanium, lanthanum, aluminum and their carbide, silicide, nitride, boride combinations. The gate dielectric 181 and 183 may include other high-K dielectrics, such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 181 and 183 may be formed by ALD, PVD, CVD, oxidation, and/or other suitable methods. In some embodiments, the gate dielectrics 181 and 183 may include the same or different materials.

The metal-containing layers 191 and 193 may include a metal, metal alloy, metal carbide, metal silicide, metal carbide silicide, metal carbide nitride, and/or metal boride. In some embodiments, the metal-containing layers 191 and 193 included in the gate stacks GS1 and GS3 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the metal-containing layers 191 and 193 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the metal-containing layers 191 and 193 may include the same or different materials.

As shown in the figure, a semiconductor device including transistors T1 and T2 is provided. A combination of the gate stack GS1, the channel portion 112C surrounded by the gate stack GS1, and the source/drain features 150 abutting the channel portion 112C forms the transistor T1 in the region A1. A combination of the gate stack GS3, the channel portion 112C surrounded by the gate stack GS3, and the source/drain features 150 abutting the channel portion 112C forms the transistor T2 in the region A3. The dielectric plug 170' is formed in the region A2 between the regions A1 and A3, so as to interpose the transistors T1 and T2. In some embodiments of the present disclosure, materials of the dielectric portions 171'-174' of the dielectric plug 170' are selected to tune the characteristics of the transistors T1 and T2, such as threshold voltage, mobility, or saturation current.

For example, in some embodiments where the materials of the gate stacks GS1 and GS3 are different, characteristics (e.g., the threshold voltage) of the transistors T1 and T2 may be different. In some embodiments of the present disclosure, materials of the dielectric portions 171'-174' of the dielectric plug are selected to tune the characteristics of transistors T1 and T2, so as to improve the performance of the semiconductor device including the transistors T1 and T2.

Though the formation of the dielectric plug 170' is performed prior to the RPG process, it should not limit the scope of the present disclosure. In some other embodiments, formation of the dielectric plug 170' may also be performed after the RPG process. For example, one or more etch operations are carried out to remove a gate stack formed using the RPG process and to recess the underlying fins. Afterwards, a dielectric material is formed in the place of the removed gate stack and the recessed fins. Thereafter, a planarization process, such as CMP, is performed to planarize the dielectric material with other gate stacks formed using the RPG process, such as the gate stacks GS1 and GS3. The resulting structure is similar to that in FIGS. 10A and 10B.

Figure 11A:
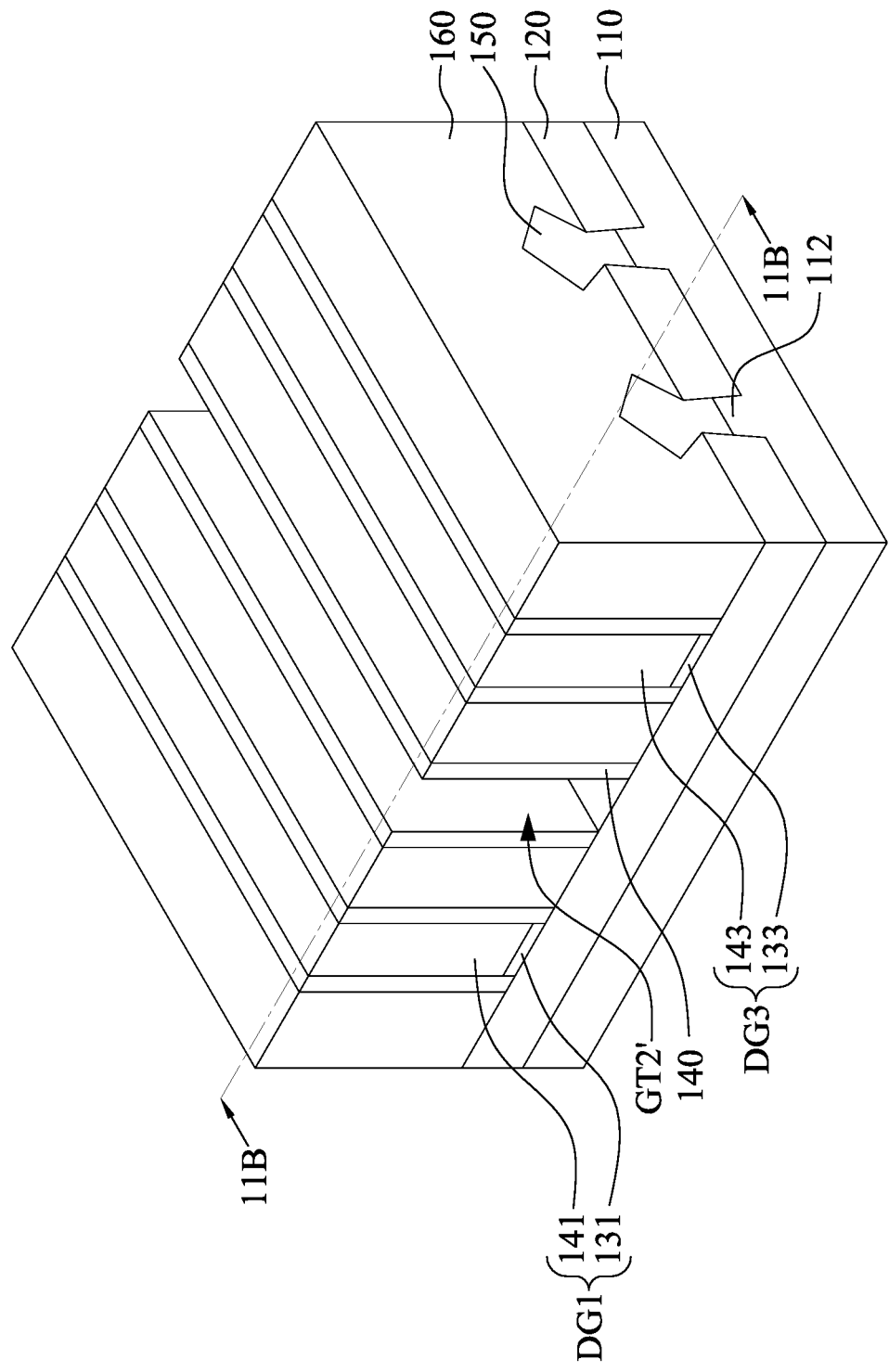
FIGS. 11A-13B illustrate a method of manufacturing a semiconductor device at various stages in accordance with some embodiments.
Figure 11B:
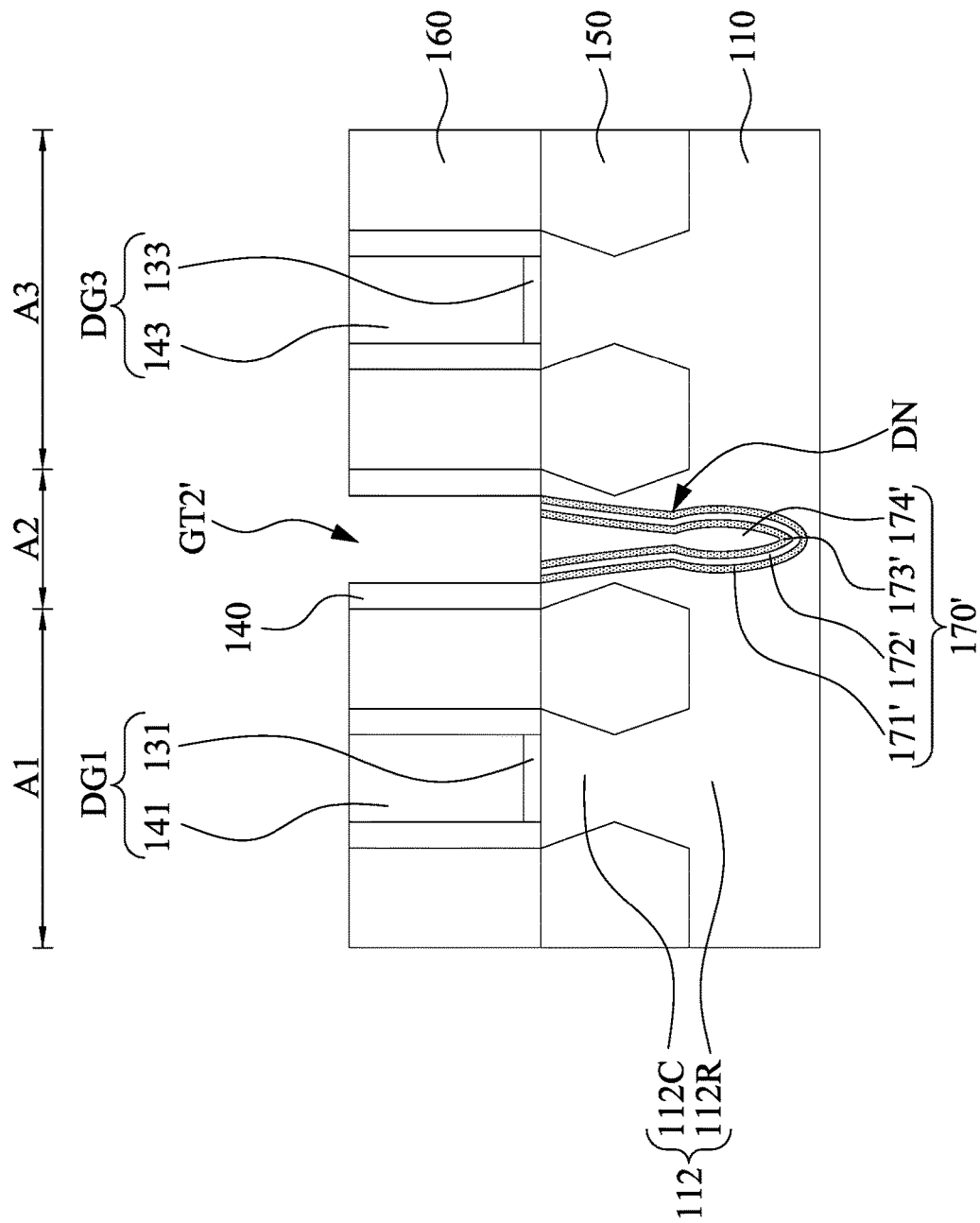

FIGS. 11A-13B illustrate a method of manufacturing a semiconductor device at various stages in accordance with some embodiments. Reference is made to FIGS. 11A and 11B. FIG. 11B is a cross-sectional view taken along line 11B-11B in FIG. 11A. After the operation shown in FIGS. 9A-9C, an etching process is performed to the dielectric plug 170', such that the first portion 170A of the dielectric plug 170' (see FIGS. 9A-9C) is removed, and a gate trench GT2' is formed between the spacers 140.

Figure 12A:
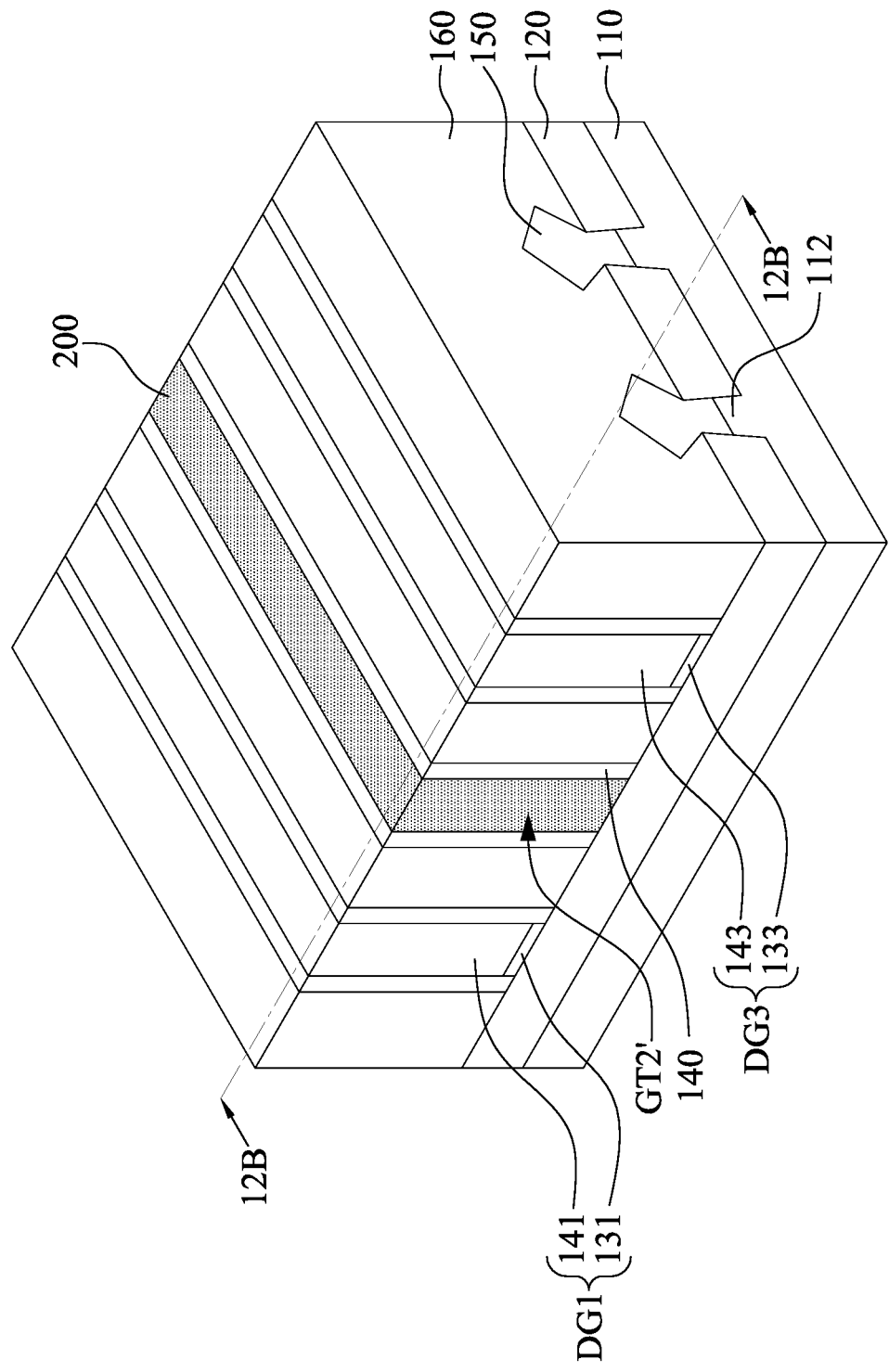
Figure 12B:
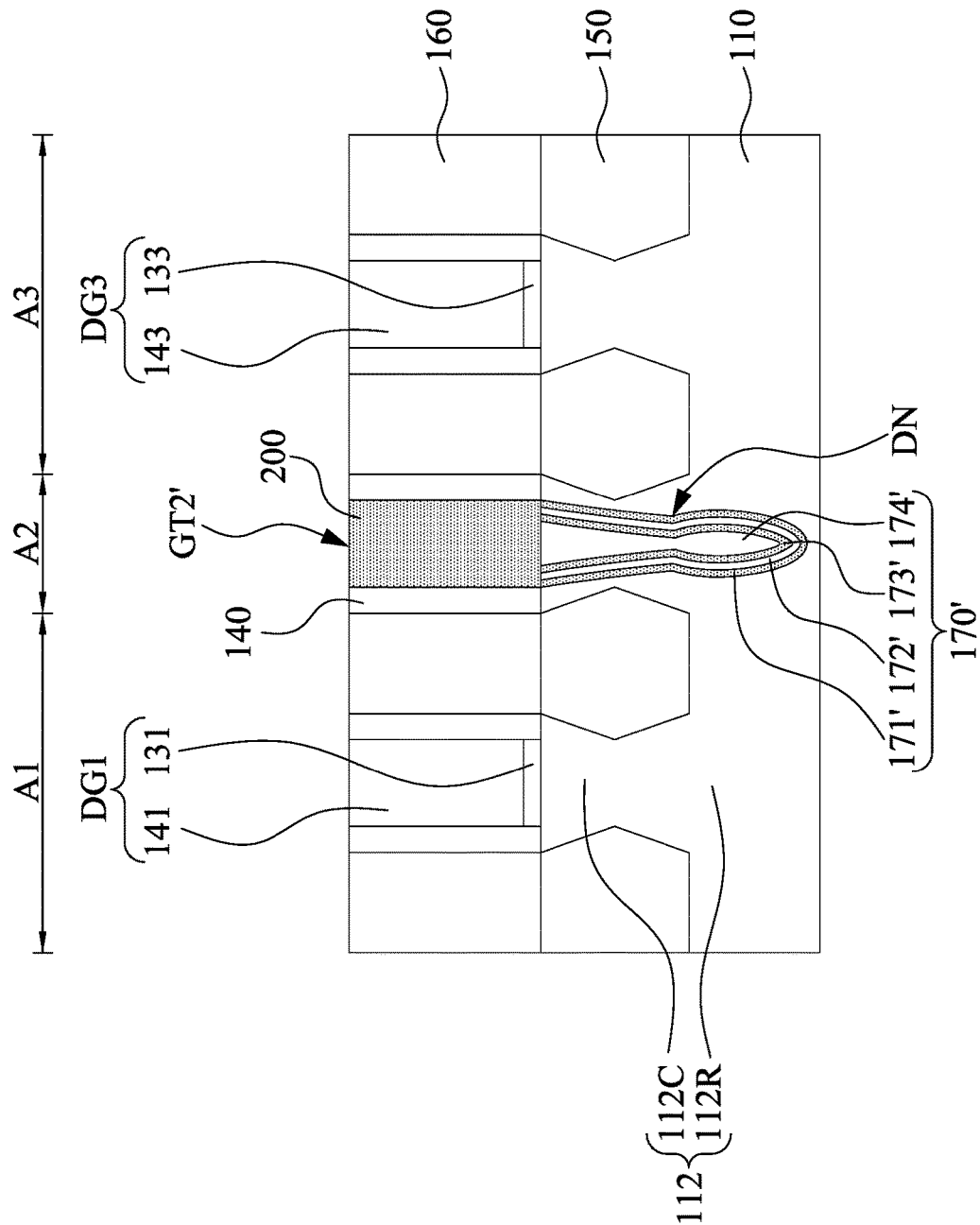

Reference is made to FIGS. 12A and 12B. FIG. 12B is a cross-sectional view taken along line 12B-12B in FIG. 12A. A dielectric fill layer 200 is formed in the gate trench GT2' and over the remaining dielectric plug 170'. In some embodiments, at least one dielectric fill material overfills the gate trench GT2'. Then, a CMP process may be optionally performed to remove an excess portion of the dielectric fill material outside the gate trench GT2', and leaves a remaining portion of the dielectric fill material, which is referred to as the dielectric fill layer 200.

The material of the dielectric fill layer 200 may be the same as that of one of the dielectric portions 171'-174'. For example, the dielectric portions 171' and 173' and the dielectric fill layer 200 include SiON, and the dielectric portions 172' and 174' may include $SiO_2$. In some embodiments, the dielectric portions 171' and 173' and the dielectric fill layer 200 include $Si_3N_4$, and the dielectric portions 172' and 174' may include $SiO_2$. Alternatively, in some other embodiments, the material of the dielectric fill layer 200 may be different from that of the dielectric portions 171'-174'.

In some other embodiments, the dielectric fill layer 200 may include two dielectric portions of different materials, while the dielectric plug 170' includes the dielectric portions 171'-174'. It is noted that, in these embodiments, the dielectric fill layer 200 and the dielectric plug 170' are not integrated formed, such that an interface between the dielectric materials of the dielectric fill layer 200 may not aligned with the interface between the dielectric portions 171'-174'.

Figure 13A:
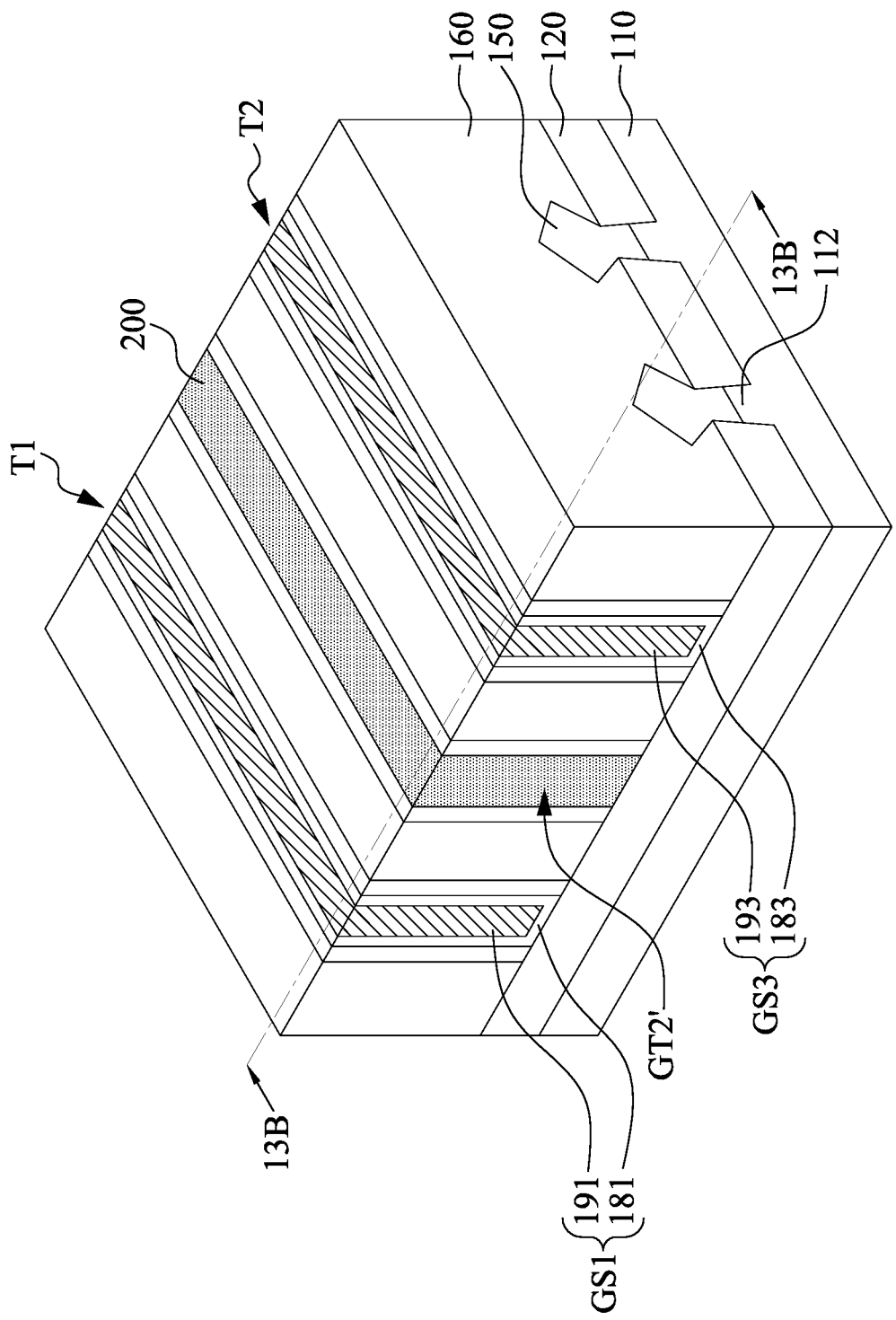
Figure 13B:
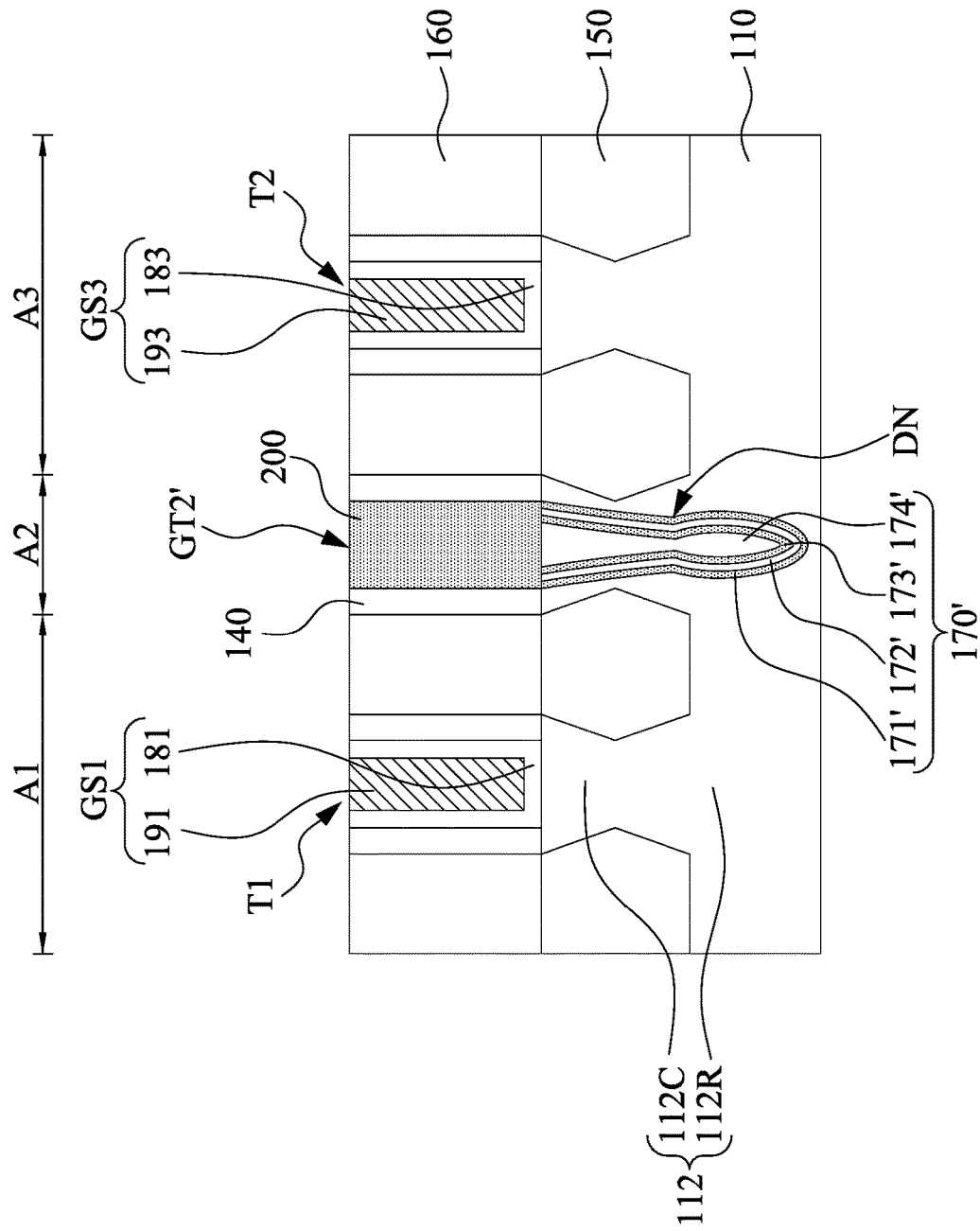

Reference is made to FIGS. 13A and 13B. FIG. 13B is a cross-sectional view taken along line 13B-13B in FIG. 13A. A RPG process scheme is employed. The dummy gate stack DG1 is replaced with a gate stack GS1, and the dummy gate stacks DG3 is replaced with a gate stack GS3. For example, the dummy gate stacks DG1 and DG3 (see FIGS. 12A and 12B) are removed to form a plurality of gate trenches. The gate trenches expose portions of the semiconductor fins 112 of the substrate 110. Then, the gate stacks GS1 and GS3 are formed respectively in the gate trenches and cover the semiconductor fins 112 of the substrate 110. Other details of the present embodiments are similar to that of aforementioned embodiments, and not repeated herein.

Figure 14:
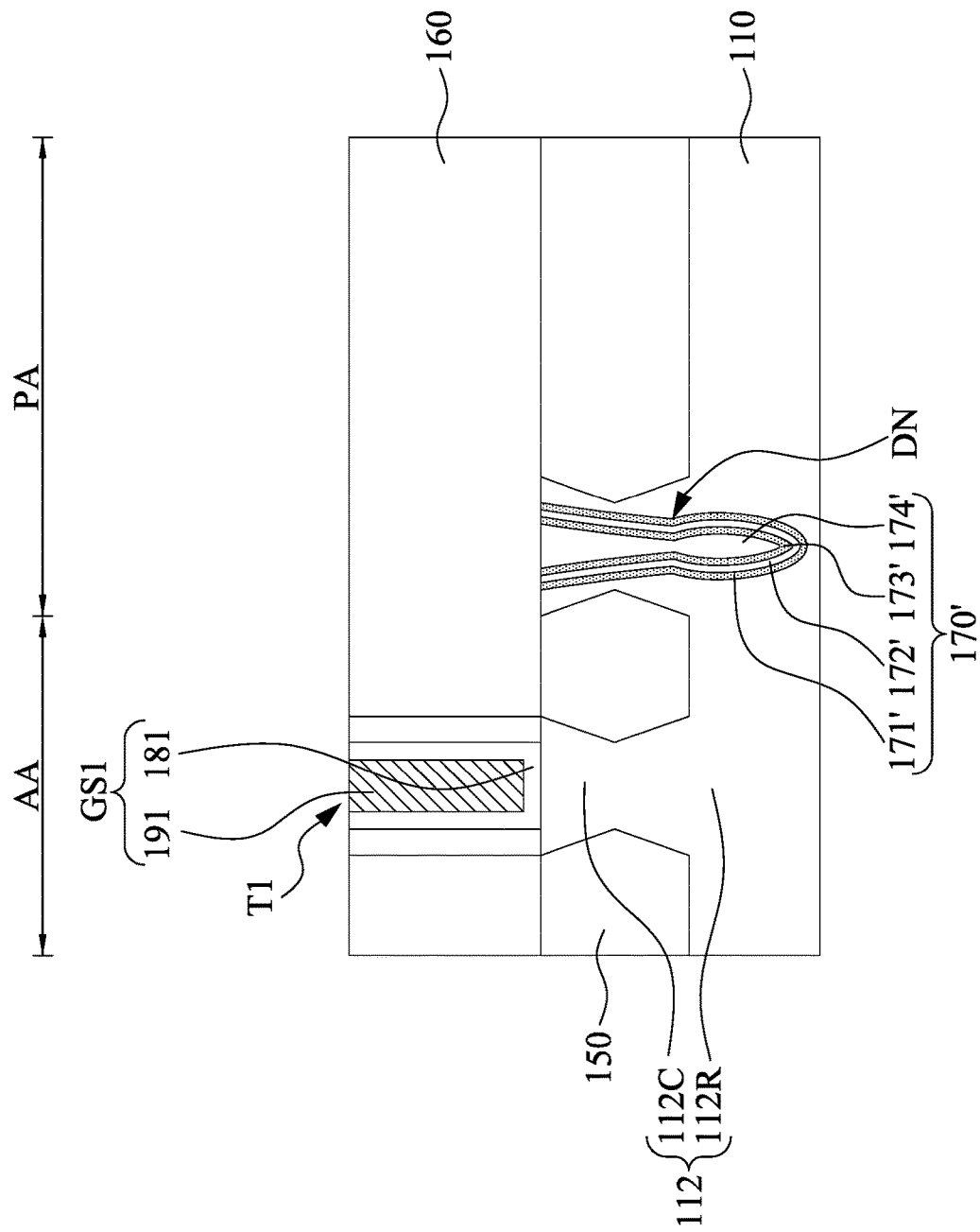
FIG. 14 is a cross-sectional view of a semiconductor device in accordance with some embodiments.

FIG. 14 is a cross-sectional view of a semiconductor device in accordance with some embodiments. The substrate 110 includes an active region AA and a peripheral region PA on at least a side of the active region AA. The gate stacks GS1 is disposed in the active region AA, while the dielectric plug 170' disposed in the peripheral region PA. In the resent embodiments, the ILD 160 surrounds the gate stacks GS1 I and covers the dielectric plug 170'. Other details of the present embodiments are similar to that of aforementioned embodiments, and not repeated herein.

Figure 15:
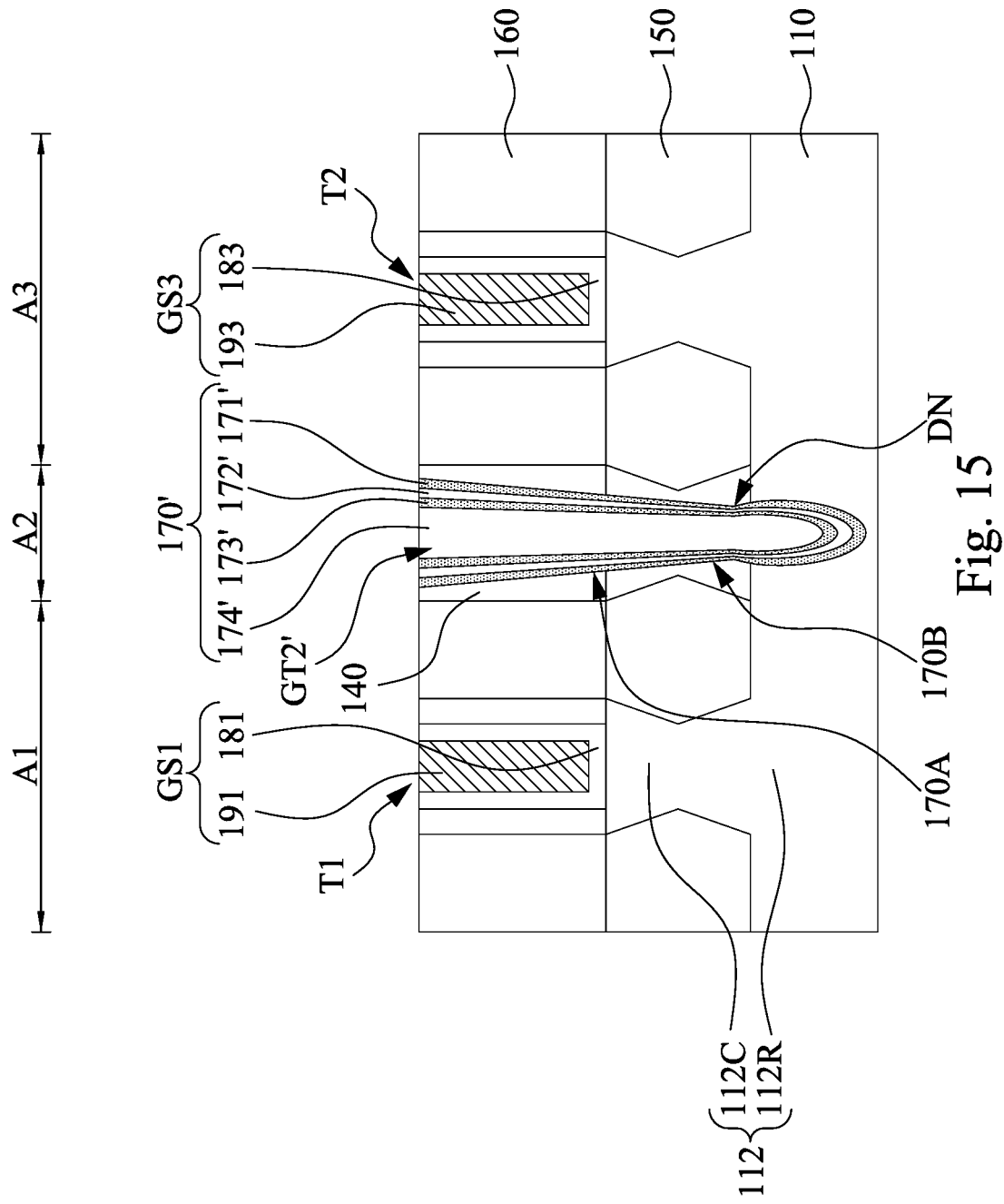
FIG. 15 is a cross-sectional view of a semiconductor device in accordance with some embodiments.

FIG. 15 is a cross-sectional view of a semiconductor device in accordance with some embodiments. The present embodiments are similar to that of FIGS. 10A and 10B, and the difference between the present embodiments and that of FIGS. 10A and 10B is that the thickness of the dielectric portions 171'-174' may vary based on their positions. For example, parts of the dielectric portions 171'-174' adjacent to the waist DN are thinner than parts of the dielectric portions 171'-174' away from the waist DN. Furthermore, parts of the dielectric portions 171'-174' adjacent to the bottom of the dielectric plug 170' is thicker than parts of the dielectric portions 171'-174' adjacent to the top of the dielectric plug 170'. In some other embodiment, the RPG process in FIGS. 11A-13B may be optionally performed. Other details of the present embodiments are similar to that of aforementioned embodiments, and not repeated herein.

Figure 16A:
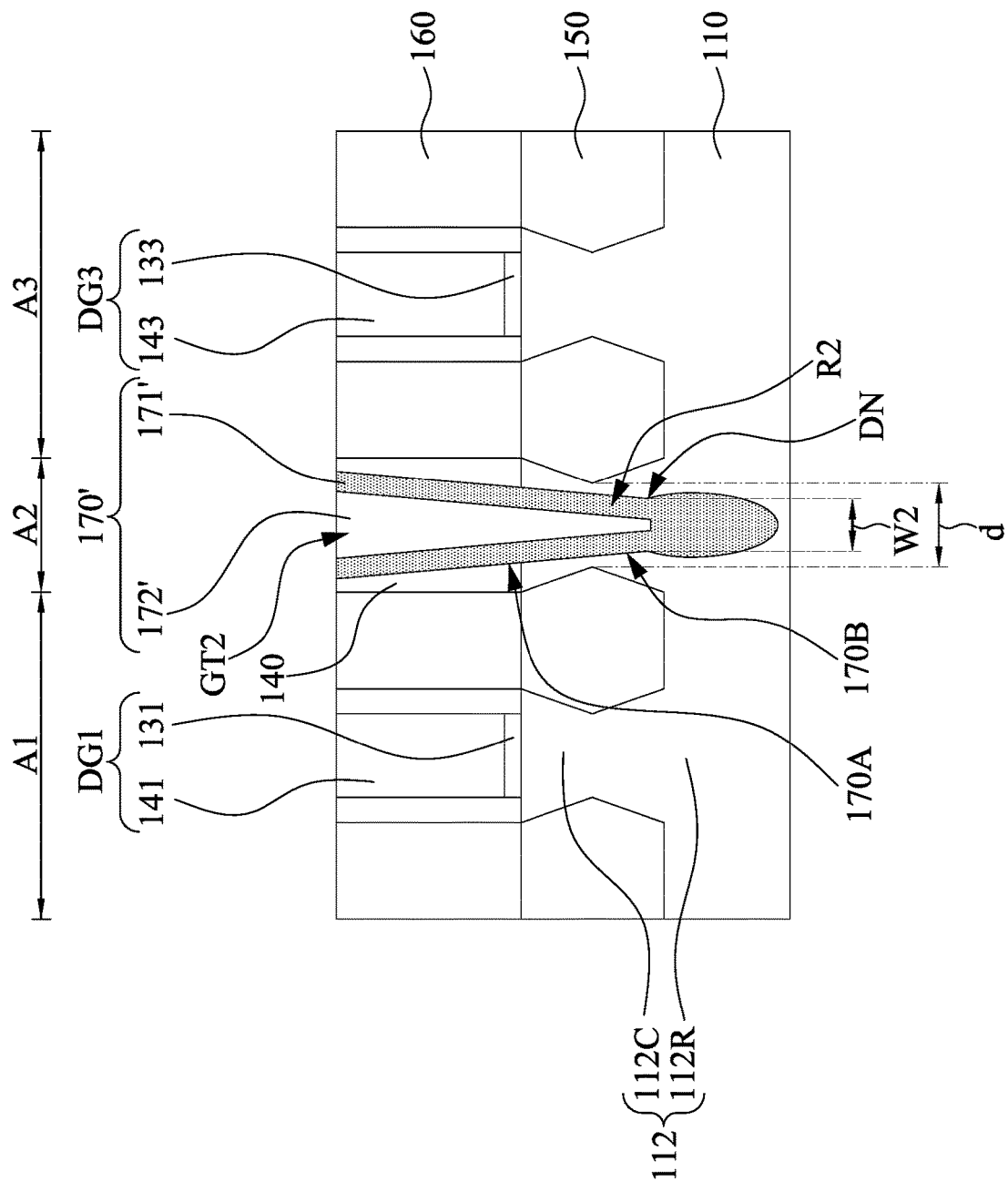
FIGS. 16A and 16B are cross-sectional views of a semiconductor device in accordance with some embodiments.
Figure 16B:
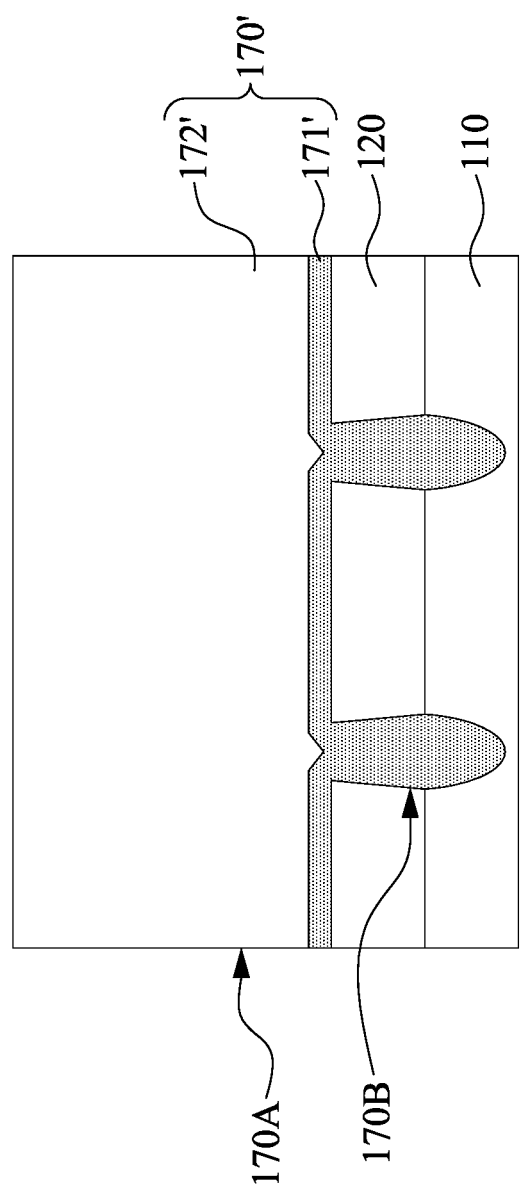

FIGS. 16A and 16B are cross-sectional views of a semiconductor device in accordance with some embodiments. The present embodiments are similar to that of FIGS. 9B and 9C, and the difference between the present embodiments and that of FIGS. 9B and 9C is that the dielectric portion 171' fills a portion of the recess R2 below the waist WN. For example, the dielectric portion 171' is conformally formed in the gate trench GT2 and the recess R2, and the dielectric portion 171' is thick enough to fill the narrowest portion of the recess R2 (i.e., the waist WN as shown in FIG. 7B). In other words, the narrowest portion of the recess R2 (i.e., the waist WN as shown in FIG. 7B) is narrow enough such that the dielectric portion 171' formed in the recess R2 fills the waist WN. Then, the dielectric portion 172' is conformally formed over the dielectric portion 171'. As such, the portion of the recess R2 below the waist WN may be made from the same material (e.g., the dielectric portion 171'), while other portion of the recess R2 above the waist WN is made from plural layers made of different materials (e.g., the dielectric portions 171' and 172'). In the present embodiments, the dielectric plug 170' includes two dielectric layers, such as the dielectric portions 171' and 172'. In some other embodiments, the dielectric plug 170' may include more than two layers, for example, the four dielectric layers illustrated previously. The RPG process in FIGS. 10A and 10B or the RPG process in FIGS. 11A-13B may be optionally performed hereinafter. Other details of the present embodiments are similar to that of aforementioned embodiments, and not repeated herein.

Based on the above discussions, it can be seen that the present disclosure offers advantages over FinFET devices. It is understood, however, that other embodiments may offer additional advantages, and not all advantages are necessarily disclosed herein, and that no particular advantage is required for all embodiments. One advantage is that a dielectric plug extends into a semiconductor fin to interpose two neighboring source/drain features, and hence the dielectric plug can act as an isolation feature between two transistors. Another advantage is that the tuning amount of dielectric plug can be easily defined by different dielectric composites, such that the dielectric plug can be customized to tune the characteristics (e.g. the threshold voltage ($V_t$)) of adjacent devices.

According to some embodiments of the present disclosure, a semiconductor device includes a substrate, first and second source/drain features, and a dielectric plug. The substrate has a semiconductor fin. The first and second source/drain features are over first and second portions of the semiconductor fin, respectively. The dielectric plug is at least partially embedded in a third portion of the semiconductor fin. The third portion is in between the first and second portions of the semiconductor fin. The dielectric plug includes a first dielectric material and a second dielectric material different from the first dielectric material.

In some embodiments, the dielectric plug includes a first dielectric layer and a second dielectric layer. The first dielectric layer includes the first dielectric material. The second dielectric layer includes the second dielectric material. The second dielectric layer wraps around the first dielectric layer.

In some embodiments, the dielectric plug further has a portion protruding from the third portion of the semiconductor fin.

In some embodiments, the semiconductor device further includes first and second spacers over the third portion of the semiconductor fin.

In some embodiments, the dielectric plug further has a portion protruding from the third portion of the semiconductor fin, and the protruding portion of the dielectric plug being in between the first and the second spacers.

In some embodiments, the semiconductor device further includes a dielectric fill layer over the dielectric plug, the dielectric fill layer being in between the first and the second spacers.

In some embodiments, the semiconductor device further includes a gate stack and a gate spacer. The gate stack is over the semiconductor fin. The gate spacer abuts the gate stack, and the first spacer and the gate spacer includes the same material.

In some embodiments, the first source/drain feature extending to a position vertically below the first spacer.

In some embodiments, the third portion of the semiconductor fin has a top higher than a top of the first portion of the semiconductor fin.

In some embodiments, the dielectric plug including a waist, and a width of the waist is less than a width of a first portion of the dielectric plug below the waist and less than a width of a second portion of the dielectric plug above the waist.

In some embodiments, the waist is in between the first source/drain feature and the second source/drain feature.

In some embodiments, the width of the waist is less than a shortest distance between the first source/drain feature and the second source/drain feature.

According to some embodiments of the present disclosure, the semiconductor device includes a substrate, a dielectric plug, and at least one source/drain feature. The substrate has a semiconductor fin. The dielectric plug is at least partially embedded in the semiconductor fin. The dielectric plug includes a first dielectric layer and a second dielectric layer conformally over the first dielectric layer. The source/drain features is over the semiconductor fin.

In some embodiments, the first dielectric layer includes a first dielectric material, and the second dielectric layer includes a second dielectric material different from that of the first dielectric material.

In some embodiments, two of the source/drain features are respectively on opposite sides of the dielectric plug, respectively.

In some embodiments, the dielectric plug has a portion protruding from the semiconductor fin.

In some embodiments, the semiconductor device further includes a dielectric fill layer covering a top surface of the dielectric plug.

In some embodiments, the semiconductor device further includes a interlayer covering a top surface of the dielectric plug.

According to some embodiments of the present disclosure, a method of manufacturing a semiconductor device includes depositing a dummy gate over a first portion of a semiconductor fin; depositing first and second epitaxy features over second and third portions of the semiconductor fin, wherein the first portion is between the second and third portions of the semiconductor fin; etching the dummy gate and a part of the first portion of the semiconductor fin to form a recess in the semiconductor fin; and depositing a dielectric plug in the recess.

In some embodiments, the method further includes forming gate spacers on opposite sides of the dummy gate, wherein forming the dielectric plug is performed such that the dielectric plug has a portion between the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
forming a dummy gate over a first portion of a semiconductor fin;
etching second and third portions of the semiconductor fin to form source and drain recesses in the semiconductor fin;
epitaxially growing first and second epitaxy features in the source and drain recesses respectively, wherein the first portion is between the first and second epitaxy features, the first epitaxy feature has a top, a bottom, a first side, and a second side, the first side of the first epitaxy feature has angled upper and lower facets, and the angled upper and lower facets of the first side of the first epitaxy feature meet at a location and are in contact with the first portion of the semiconductor fin;
etching the dummy gate and a first part of the first portion of the semiconductor fin to form a recess in the semiconductor fin; and
forming a dielectric plug in the recess, wherein the dielectric plug comprises a waist in between the first epitaxy feature and the second epitaxy feature and lower than the location where the angled upper and lower facets of the first side of the first epitaxy feature meet, and a width of the waist is less than a width of a first portion of the dielectric plug below the waist.

2. The method of claim 1, further comprising:
forming gate spacers on opposite sides of the dummy gate, wherein forming the dielectric plug is performed such that the dielectric plug has a second portion between the gate spacers.

3. The method of claim 1, wherein the width of the waist is less than a shortest distance between the first epitaxy feature and the second epitaxy feature, and the width of the first portion of the dielectric plug is greater than the shortest distance between the first epitaxy feature and the second epitaxy feature.

4. The method of claim 1, wherein forming the dielectric plug is performed such that a bottom of the dielectric plug is lower than the bottom of the first and second epitaxy features epitaxy feature.

5. The method of claim 1, wherein forming the dielectric plug comprises:
depositing a first dielectric layer in the recess; and
depositing a second dielectric layer over the first dielectric layer in the recess, wherein the second dielectric layer has a material different from that of the first dielectric layer, and a first portion of the second dielectric layer adjacent to the waist has a thickness less than that of a second portion of the second dielectric layer adjacent to a bottom of the dielectric plug.

6. A method of manufacturing a semiconductor device, comprising:
forming a semiconductor fin on a substrate, wherein the semiconductor fin protrudes from a top surface of the substrate;
forming a dummy gate over a portion of the semiconductor fin;
forming gate spacers on opposite sides of the dummy gate;
removing the dummy gate to form a gate trench between the gate spacers, such that the gate trench exposes the portion of the semiconductor fin;
etching a recess in the portion of the semiconductor fin; and
forming a dielectric plug in the recess, wherein a bottommost surface of the dielectric plug is lower than the top surface of the substrate, the dielectric plug in the recess has a waist, a first portion lower than the waist, and a second portion higher than the waist and lower than a top surface of the semiconductor fin, a width of the second portion of the dielectric plug is greater than a width of the waist, and a width of the first portion of the dielectric plug is greater than the width of the waist.

7. The method of claim 6, wherein forming the dielectric plug comprises:
depositing a first dielectric layer in the recess; and
depositing a second dielectric layer over the first dielectric layer in the recess, wherein the second dielectric layer has a material different from that of the first dielectric layer.

8. The method of claim 6, further comprising:
forming an isolation structure surrounding the semiconductor fin prior to forming the dummy gate, wherein forming the dielectric plug is performed such that the dielectric plug is in contact with a top surface of the isolation structure.

9. The method of claim 6, further comprising:
forming an isolation structure surrounding the semiconductor fin prior to forming the dummy gate, wherein forming the dielectric plug is performed such that the dielectric plug is in contact with a sidewall of the isolation structure.

10. The method of claim 6, further comprising:
forming an isolation structure surrounding the semiconductor fin prior to forming the dummy gate, wherein forming the dielectric plug is performed such that the bottommost surface of the dielectric plug is lower than a bottommost surface of the isolation structure.

11. A method of manufacturing a semiconductor device, comprising:
forming a first dummy gate over a first portion of a semiconductor fin;
depositing an epitaxy feature over a second portion of the semiconductor fin,
etching a recess in a third portion of the semiconductor fin after depositing the epitaxy feature, wherein the second portion is between the first and third portions of the semiconductor fin; and
forming a dielectric plug in the recess, wherein the recess is free of a conductive material, wherein forming the dielectric plug comprises:
depositing a first dielectric layer in the recess;
depositing a second dielectric layer over the first dielectric layer;
depositing a third dielectric layer over the second dielectric layer; and
depositing a dielectric material in the recess after depositing the third dielectric layer, wherein each of the first dielectric layer, the second dielectric layer, the third dielectric layer, and the dielectric material has at least a portion lower than a bottom of the epitaxy feature.

12. The method of claim 11, further comprises:
replacing the first dummy gate with a metal gate after forming the dielectric plug.

13. The method of claim 11, further comprises:
forming a second dummy gate over the third portion of the semiconductor fin prior to depositing the epitaxy feature; and
removing the second dummy gate prior to etching the recess in the third portion of the semiconductor fin.

14. The method of claim 13, wherein removing the second dummy gate comprises:
forming a patterned mask covering the first dummy gate and exposing the second dummy gate; and
etching the second dummy gate through the patterned mask.

15. The method of claim 11, further comprises:
recessing the second portion of the semiconductor fin prior to depositing the epitaxy feature.

16. The method of claim 11, wherein forming the dielectric plug in the recess is performed such that the recess is completely filled with the dielectric material.

17. The method of claim 1, wherein forming the dielectric plug is performed such that the waist of the dielectric plug is laterally aligned with the lower facet of the first side of the first epitaxy feature.

18. The method of claim 11, wherein the semiconductor fin protrudes from a top surface of a substrate, and forming the dielectric plug is performed such that each of the first dielectric layer, the second dielectric layer, the third dielectric layer, and the dielectric material has a bottom lower than the top surface of the substrate.

19. The method of claim 11, wherein the first and third dielectric layers comprise a nitride material, the second dielectric layer and the dielectric material comprise an oxide material, and the nitride material is different from the oxide material.

20. The method of claim 11, wherein the dielectric material in the recess has a waist, a first portion below the waist, and a second portion below a top surface of the semiconductor fin and above the waist, and a width of the waist of the dielectric material is less than a width of the first portion of the dielectric material and less than a width of the second portion of the dielectric material.

* * * * *